US007018777B2

(12) United States Patent
Ohnishi

(10) Patent No.: US 7,018,777 B2

(45) Date of Patent: Mar. 28, 2006

(54) METHOD OF MAKING LITHOGRAPHIC PRINTING PLATE

(75) Inventor: Hironori Ohnishi, Shizuoka-ken (JP)

(73) Assignee: Fuji Photo Film Co., Ltd., Minami-Ashigarra (JP)

( * ) Notice: Subject to any disclaimer, the term of this patent is extended or adjusted under 35 U.S.C. 154(b) by 77 days.

(21) Appl. No.: 10/658,399

(22) Filed: Sep. 10, 2003

(65) Prior Publication Data

US 2004/0053168 A1 Mar. 18, 2004

(30) Foreign Application Priority Data

Sep. 11, 2002 (JP) ............................ 2002-265761

(51) Int. Cl.
*G03F 7/26* (2006.01)
*G03F 7/32* (2006.01)

(52) U.S. Cl. ...................... 430/302; 430/309; 430/401; 430/434; 430/435; 430/494; 430/944; 430/945

(58) Field of Classification Search ................ 430/302, 430/309, 401, 434, 435, 494, 944, 945
See application file for complete search history.

(56) References Cited

U.S. PATENT DOCUMENTS

| | | | | |
|---|---|---|---|---|
| 6,040,113 | A | 3/2000 | Van Damme et al. | |
| 6,365,330 | B1 | 4/2002 | Leichsenring et al. | |
| 6,472,119 | B1 * | 10/2002 | Verschueren et al. | 430/270.1 |
| 2003/0129532 | A1 * | 7/2003 | Kawauchi et al. | 430/271.1 |
| 2003/0157434 | A1 * | 8/2003 | Oda et al. | 430/273.1 |
| 2004/0002019 | A1 * | 1/2004 | Nagase | 430/302 |
| 2004/0101780 | A1 * | 5/2004 | Maemoto | 430/273.1 |

FOREIGN PATENT DOCUMENTS

| | | | |
|---|---|---|---|
| EP | 0 390 480 | A1 | 10/1990 |
| EP | 0 517 245 | A1 | 12/1992 |
| EP | 0 580 532 | A2 | 1/1994 |
| EP | 1 023 994 | A1 * | 8/2000 |
| EP | 1 110 747 | A1 | 6/2001 |
| EP | 1 182 512 | A1 | 2/2002 |
| EP | 1 275 498 | A2 * | 1/2003 |
| EP | 1 376 241 | A1 | 1/2004 |
| JP | 60-225152 | A | 11/1985 |
| JP | 10-250255 | | 9/1998 |
| JP | 2001-166477 | | 6/2001 |
| JP | 2002-182400 | | 6/2002 |
| JP | 2002-182400 | A | 6/2002 |

* cited by examiner

*Primary Examiner*—Barbara L. Gilliam
(74) *Attorney, Agent, or Firm*—Buchanan Ingersoll PC

(57) ABSTRACT

A method of making a printing plate from a heat-sensitive PS plate of a positive-working mode for lithographic printing includes the steps of exposing the heat-sensitive PS plate to light and developing the PS plate using an alkaline developing solution containing at least one surfactant selected from the group consisting of anionic surfactants and ampholytic surfactants, and a salt selected from the group consisting of alkali metal salts and ammonium cation salts. The PS plate has a substrate and an image forming layer formed thereon, the image forming layer including a lower layer which is formed on the substrate and contains a water-insoluble and alkali-soluble resin and an upper heat-sensitive layer which is overlaid on the lower layer and contains a water-insoluble and alkali-soluble resin and an infrared absorption dye and exhibits an elevated solubility with respect to alkaline aqueous solutions when heated.

15 Claims, No Drawings

METHOD OF MAKING LITHOGRAPHIC PRINTING PLATE

FIELD OF THE INVENTION

The present invention relates to a method of making a printing plate from a heat-sensitive pre-sensitized plate for lithographic printing, which will be possibly hereinafter referred to as a PS plate for lithographic printing, capable of achieving direct plate making, that is, making a printing plate directly by exposing the PS plate to infrared laser scanning based on digital signals from computers or the like.

BACKGROUND OF THE INVENTION

There have been great strides made in the study of laser in recent years. In particular, solid lasers and semiconductor lasers that can emit light of wavelengths ranging from the near infrared region to the infrared region are available in the form of high-powered, small-sized laser devices. Such laser devices are remarkably useful as the light sources for light exposure when printing plates are made by direct transfer of digital data from computers or the like to image recording materials.

An image recording material for use in the PS plate of a positive-working mode for lithographic printing used with infrared laser comprises as the essential components a binder resin soluble in alkaline aqueous solutions and an infrared absorption dye, which will be hereinafter referred to as an IR dye, capable of absorbing infrared laser beam to emit heat. At a non-light exposed portion (which will serve as an image portion) in the image recording material, the IR dye serves to inhibit the binder resin from substantially dissolving in an alkaline developing solution as a result of the interaction between the IR dye and the binder resin. At a light exposed portion (which will become a non-image portion), on the other hand, the interaction between the IR dye and the binder resin is diminished by heat generated, which allows the light exposed portion to dissolve in the alkaline developing solution. Thus, a printing plate for lithographic printing can be formed.

However, the above-mentioned PS plate of a positive-working mode for lithographic printing used with infrared laser has the shortcoming that development is so subject to variations of operating conditions that the degree of development can become excessive or insufficient. This problem is caused because the difference between the force that can stop the image recording material from dissolving in the developing solution at the non-light exposed portion (image portion) and the solubility of the image recording material in the developing solution at the light exposed portion (non-image portion) is considered to be still insufficient in light of a variety of operating conditions. Another problem is that the difference between the light exposed portion and the non-exposed portion in the image recording layer of the PS plate becomes attenuated around the area in close proximity of a substrate of the PS plate, which results in poor reproduction of highlight portions. More specifically, the image forming performance of the PS plate for lithographic printing depends upon the heat generated when the surface of the image recording layer of the PS plate is exposed to the infrared laser. The heat conducting through the image recording layer is unfavorably diffused around the area adjacent to the substrate of the PS plate, where the thermal energy used for image formation, that is, used for making the image recording layer soluble in the developing solution is lowered.

No problem has been generated about the latitude for development in the conventional image recording materials for use in the PS plate of a positive-working mode for lithographic printing capable of forming a printing plate through the exposure to UV light. One example of such conventional image recording materials comprises a binder resin that is soluble in alkaline aqueous solutions and an onium salt, quinonediazide compound or the like. In the non-light exposed portion serving as an image portion, the onium salt or quinonediazide compound causes the interaction with the binder resin to inhibit the corresponding portion from dissolving in the developing solution. In the light exposed portion (non-image portion), the onium salt or quinonediazide compound is decomposed by the application of light thereto to generate an acid, which helps to dissolve the image recording material of the light exposed portion in the developing solution. In this case, however, the problem about the reproduction of highlight portions is also generated because of disturbance of light while the UV exposure is imagewise carried out via a lith type film.

In the case of the image recording materials for the PS plate of a positive-working mode for lithographic printing used with infrared laser, an infrared absorption agent or the like does not help to dissolve the alkali-soluble polymer in the developing solution at the light exposed portion, but just works to inhibit the alkali-soluble polymer from dissolving in the developing solution at the non-light exposed portion. Therefore, it is inevitable to use a binder resin that can originally show high solubility with respect to the alkaline developing solution in order to generate a significant difference between the solubility of the non-light exposed portion and that of the light exposed portion in the alkaline developing solution. This will cause the problems that the scratch resistance is lowered and the image recording material for use in the image recording layer becomes unstable before the initiation of development.

To solve the above-mentioned problems, it is proposed to provide a PS plate with a multi-layered image recording layer, which comprises an upper heat-sensitive layer of which the solubility in the developing solution can drastically change at the time of image formation, and a lower layer that is characterized by high solubility in alkaline solutions, as disclosed in JP KOKAI No. Hei 10-250255 (JP KOKAI herein means a publication of Japanese patent application). In addition, as disclosed in JP KOKAI No. 2001-166477, it is proposed to provide an overcoating layer on an image recording layer in the PS plate of a positive-working mode. In this case, the image recording layer comprises a polymer that is soluble in the alkaline developing solution and a near infrared absorption dye, and the overcoating layer formed on the image recording layer is a near infrared-sensitive layer that shows higher alkali resistance than the image recording layer. Further, for example, JP KOKAI No. 2002-182400 has proposed a plate-making process comprising image-wise exposing a positive-working PS plate wherein a lower layer is located on a hydrophilic substrate and the lower layer comprises a water-insoluble and alkali-soluble resin, and an upper heat-sensitive layer is located on the lower layer and the upper layer comprises a water-insoluble and alkali-soluble resin and an infrared absorption dye and exhibits an elevated solubility with respect to alkaline aqueous solutions when heated; and then developing the plate with an alkaline developing solution comprising as main components an organic compound having a buffering action and a base. However, the thermal efficiency at the light exposed portion is still low because of absorption of heat by the substrate such as an aluminum plate, so that the resultant solubility of the light exposed portion in the alkaline developing solution is not satisfactory at the step of development. Then, it is required to ensure the sufficient solubility of the light exposed portion of the image recording material in the developing solution by increasing the alkali content in the developing solution.

However, there occurs the following problem. Even though the image recording layer having a laminated structure as mentioned above is employed for the PS plate, the force to prevent the image recording material at the non-light exposed portion from dissolving in the alkaline developing solution is still insufficient in the case where the alkali content of the developing solution is elevated. If there exists even a slight scratch on the surface of the image recording material at the non-light exposed portion, the image recording material will easily be dissolved in the developing solution, thereby causing a defective image. The above-mentioned problem has not yet been solved.

When consideration is given to the above, there is a limit to the alkali content in the developing solution even though the increase of alkali content in the developing solution is intended to clear the image recording material off the PS plate at the light exposed portion (non-image portion). It has been considered difficult to form sharp images with high contrast without damaging the formed image portion. Therefore, in order to form image portions with higher contrast in the PS plate having such a multi-layered image recording layer as mentioned above and to impart higher scratch resistance to the PS plate, improvements should be proposed from the aspect of the alkaline developing solution that is used to develop the PS plate.

In addition, there is a problem that in a course of development, an infrared absorption dye, a binder polymer and the like are dissolved from the image recording material into a developing solution and insoluble matter originated from these compounds are accumulated and agglutinated to make development sludge, which may be a cause of damaging processing stability. More specifically, such insoluble matter may adhere to a plate during development procedure in making a printing plate, and then image areas of the plate may be impaired. In addition, the insoluble matter is precipitated and deposited in a processing tank and disadvantageously leads to a large labor or cost for maintenance of processing tanks. Accordingly, there is also a need to resolve the problem of the development sludge.

SUMMARY OF THE INVENTION

An object of the present invention is to provide a method of directly making a printing plate that is excellent in image contrast and scratch resistance from a heat-sensitive PS plate of a positive-working mode for lithographic printing, in particular, from a heat-sensitive PS plate of a positive-working mode comprising an image forming layer with a laminated structure. An another object of the present invention is to provide a method of making a lithographic printing plate wherein development sludge is favorably dispersed in a course of development process, and lead to a stable image-forming method.

The inventor of the present invention has intensively studied to achieve the above-mentioned object. As a result, it has been found that a lithographic printing plate having image portions with high contrast can be obtained, the image formation can be achieved with an excellent scratch resistance, and development sludge is well dispersed through developing a heat-sensitive PS plate of a positive-working mode for lithographic printing comprising an image forming layer with a laminated structure using an alkaline developing solution comprising a particular surfactant and a particular salt. The present invention has been thus accomplished.

Accordingly, the present invention provides a method of making a lithographic printing plate from a heat-sensitive pre-sensitized plate of a positive-working mode for lithographic printing comprising the steps of:

exposing the heat-sensitive pre-sensitized plate to light, and developing the plate using an alkaline developing solution comprising (a) at least one surfactant selected from the group consisting of anionic surfactants and ampholytic surfactants, and (b) at least one salt selected from the group consisting of alkali metal salts and salts of an ammonium cation, wherein the pre-sensitized plate comprises a substrate, a lower layer which comprises a water-insoluble and alkali-soluble resin, and an upper heat-sensitive layer which comprises a water-insoluble and alkali-soluble resin and an infrared absorption dye and exhibits an elevated solubility with respect to alkaline aqueous solutions when heated, said lower layer and said upper heat-sensitive layer being located on the substrate in this order.

The PS plate for use in the present invention comprises more specifically, a substrate for lithographic printing plate and an image forming layer on the substrate, said image forming layer comprising the lower layer and the upper heat-sensitive layer located on the lower layer.

In a preferred embodiment, the above-mentioned anionic surfactant for use in the developing solution is selected from the group consisting of carboxylic acid type anionic surfactants and sulfonic acid type anionic surfactants, and the ampholytic surfactant is selected from alkylaminocarboxylic acids.

DETAILED DESCRIPTION OF THE INVENTION

The alkaline developing solution for use in the present invention, which will also be hereinafter referred to as the developing solution simply, will now be explained in detail.

The developing solution for use in the present invention is an alkaline aqueous solution, which can appropriately be chosen from the conventional alkaline aqueous solutions.

The developing solutions for use in the present invention include an alkaline aqueous solution comprising an alkali silicate or a nonreducing sugar and a base. The alkaline developing solutions having a pH range from 12.5 to 14.0 are particularly preferable.

The above-mentioned alkali silicate shows alkaline properties when dissolved in water. For example, silicates of alkali metals such as sodium silicate, potassium silicate and lithium silicate, and ammonium silicate can be used. Such alkali silicates may be used alone or in combination.

The development performance of the alkaline aqueous solution comprising the above-mentioned alkali silicate can easily be controlled by adjusting the mixing ratio of the components constituting the silicate, that is, silicon dioxide ($SiO_2$) and alkali oxide represented by $M_2O$, wherein M is an alkali metal or ammonium group, and the concentration of the alkali silicate.

In the above-mentioned alkaline aqueous solution, it is preferable that the molar ratio of the silicon dioxide ($SiO_2$) to the alkali oxide ($M_2O$) be in the range of 0.5 to 3.0 from the aspect of moderate alkalinity and developing performance, and more preferably 1.0 to 2.0.

The concentration of the alkali silicate in the developing solution is preferably in the range of 1 to 10% by weight from the aspect of developing performance and processing ability, more preferably 3 to 8% by weight, and most preferably 4 to 7% by weight, with respect to the total weight of the alkaline aqueous solution.

In the developing solution comprising a nonreducing sugar and a base, the nonreducing sugars mean sugars having no reducing properties due to the absence of free aldehyde group and ketone group. The nonreducing sugars are classified into trehalose type oligosaccharides prepared by linking reducing groups together, glycosides prepared by joining a reducing group of sugars with non-sugars, and sugar alcohols prepared by reducing sugars with hydrogenation. Any of the above-mentioned nonreducing sugars can preferably be used in the present invention.

The trehalose type oligosaccharides include, for example, saccharose and trehalose; and the glycosides include, for example, alkyl glycoside, phenol glycoside, and mustard oil glycoside.

Examples of the sugar alcohols are D, L-arabitol, ribitol, xylitol, D, L-sorbitol, D, L-mannitol, D, L-iditol, D, L-talitol, meso-inositol, dulcitol, and allodulcitol. Further, maltitol obtained by subjecting disaccharides to hydrogenation and reductants (e.g., reduced starch syrup) obtained by subjecting oligosaccharides to hydrogenation are also preferred.

Among the above-mentioned nonreducing sugars, trehalose type oligosaccharides and sugar alcohols, in particular, saccharose, D-sorbitol and reduced starch syrup are preferably employed because there can be obtained a buffering action to lead to an adequate pH range.

Those nonreducing sugars may be used alone or in combination. The amount of the nonreducing sugar in the developing solution is preferably in the range of 0.1 to 30% by weight, more preferably 1 to 20% by weight.

The above-mentioned alkali silicate or nonreducing sugar can be used in combination with a base, which may appropriately be selected from the conventional alkaline chemicals, and a pH value of the developing solution can be adjusted.

Examples of the alkaline chemicals include sodium hydroxide, potassium hydroxide, lithium hydroxide, and the like.

In addition to the above, organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine can also be used.

Those alkaline chemicals may be used alone or in combination.

Among the above-mentioned alkaline chemicals which are suitable are sodium hydroxide and potassium hydroxide. By controlling the amount of the alkaline chemicals such as sodium hydroxide and potassium hydroxide with respect to the nonreducing sugar, the pH value of the developing solution can be determined within a wide range.

[(a) At Least One Compound Selected from the Group Consisting of Anionic Surfactants and Ampholytic Surfactants]

The developing solution for use in the present invention comprises at least one surfactant selected from the group consisting of anionic surfactants and ampholytic surfactants, which surfactant is contained in the above-mentioned alkaline aqueous solution.

In the present invention, the function of the surfactant is to improve the dispersion properties of the resin exposed to light and dissolved in the developing solution, and increase the solubility of the alkali-soluble resin remaining in the concave portions formed on the surface of the substrate with respect to the alkaline developing solution. As a result, extremely sharp images can be formed. Moreover, the surfactant can also serve to disperse insoluble components, if any in the resin composition for use in the image forming layer of the PS plate, in the developing solution when the resin is dissolved therein.

Examples of the anionic surfactant include fatty acid salts, abietates, hydroxyalkanesulfonates, alkanesulfonates, alkyldiphenyl ether sulfonates, diphenyl ether disulfonates, dialkylsulfosuccinate ester salts, linear alkylbenzenesulfonates, branched alkylbenzenesulfonates, alkylnaphthalenesulfonates, alkylphenoxy polyoxyethylenepropylsulfonates, polyoxyethylene alkylsulfophenyl ether salts, sodium salts of N-methyl-N-oleyltaurine, disodium salts of N-alkylsulfosuccinic monoamide, petroleum sulfonates, sulfated tallow oil, sulfates of fatty acid alkyl esters, alkyl sulfates, polyoxyethylene alkyl ether sulfates, fatty acid monoglyceride sulfates, polyoxyethylene alkylphenyl ether sulfates, polyoxyethylene styrylphenyl ether sulfates, alkyl phosphates, polyoxyethylene alkyl ether phosphates, polyoxyethylene alkylphenyl ether phosphates, partially saponified styrene—maleic anhydride copolymers, partially saponified olefin—maleic anhydride copolymers, and condensates of naphthalenesulfonate and formalin. In particular, preferably used are carboxylic acid type surfactants such as fatty acid salts and abietates, and sulfonic acid type surfactants such as hydroxyalkanesulfonates, alkanesulfonates, alkyldiphenyl ether sulfonates, diphenyl ether disulfonates, dialkylsulfosuccinate ester salts, olefin sulfonates, linear alkylbenzenesulfonates, branched alkylbenzenesulfonates, alkylnaphthalenesulfonates, alkylphenoxy polyoxyethylene propylsulfonates, polyoxyethylene alkylsulfophenyl ether salts, disodium salts of N-alkylsulfosuccinic monoamide, petroleum sulfonates, and condensates of naphthalenesulfonate and formalin.

Among the anionic surfactants preferably used in the present invention, more preferred is the surfactant having in the molecule thereof, two or more hydrophilic groups such as a sulfonic group and a carboxylic group. Specific examples of the more preferable anionic surfactants are diphenylether disulfonate salts represented by the following general formula (I):

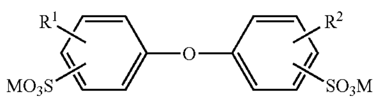

(I)

wherein $R^1$ and $R^2$ each represents a hydrogen atom or a linear or branched alkyl group, and M represents a monovalent alkali metal. The alkyl group may be preferably those having 1 to 40 carbon atoms, and more preferably 4 to 20 carbon atoms, and specific example thereof include $n-C_8H_{17}$ and $n-C_{12}H_{25}$. The alkali metal is not limited and preferred are sodium, potassium and lithium.

The ampholytic surfactants for use in the present invention include alkylaminocarboxylic acids of alkyl betaine type, amide betaine type, imidazolinium betaine type, alkyl glycine type, and alkyl alanine type; and sulfobetaine type surfactants. In particular, alkylaminocarboxylic acids of alkyl glycine type and alkyl alanine type are preferably employed.

Suitable ampholytic surfactants for use in the present invention include alkylamino dicarboxylic acids and salts thereof represented by the following general formula (II):

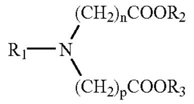

(II)

wherein $R_1$ represents an alkyl group having 4 to 30 carbon atoms, $R_2$ and $R_3$ each represents a hydrogen atom or a monovalent alkali metal, and n and p each represents an integer from 1 to 10.

The developing solution for use in the present invention may comprise at least one anionic surfactant or ampholytic surfactant, or both.

It is preferable that the amount of the above-mentioned surfactant in the developing solution be in the range of 0.001 to 10% by weight from the aspect of image-forming properties, developing ability and inhibiting action on occurrence of insoluble matter, more preferably 0.005 to 1% by weight, and most preferably 0.01 to 0.5% by weight.

[(b) At Least One Compound Selected from the Group Consisting of Alkali Metal Salts and Salts of an Ammonium Cation]

In addition, the developing solution for use in the present invention comprises at least one selected from an alkali metal salt and an ammonium cation ($NH_4^+$) salt, which is contained in the previously mentioned alkaline aqueous solution.

Such a salt for use in the present invention has an effect of improving the penetration of the alkaline solution into the light exposed portion of the image forming layer, and increasing the solubility of the alkali-soluble resin remaining in the concave portions formed on the surface of the substrate with respect to the alkaline developing solution. This can achieve the formation of extremely sharp images. Consequently, the use of such salts can lower the alkalinity (pH) of the developing solution, which will significantly contribute to the improvement of the scratch resistance of the image portion formed on the PS plate.

The alkali metal salts or ammonium cation salts added to the developing solution include inorganic salts such as halide, sulfate, nitrate, phosphate, carbonate and borate; and organic acid salts such as formate, acetate, propionate, maleate, lactate, levulinate, malonate, adipate, fumarate, citrate, and malate. In particular, the alkali metal salts are preferred, and further potassium salts, sodium salts and lithium salts are preferable. Salts suitably used include salts having less organic nature such as inorganic salts, formates and acetates, and hydroxy acid salts such as citrates and malates, because the these salts do not cause scumming relating to the substrate surface. Among these, more suitably used are chloride salt, nitrate, sulfate, phosphate, carbonate, borate, acetate and citrate. The above alkali metal salts or ammonium cation salts exclude a silicate.

The developing solution for use in the present invention may contain one of the above-mentioned salt compounds or two or more compounds in combination.

The effects of the above-mentioned salt compounds rather depend upon the molarity of the alkali metal or ammonium cation in the developing solution. The amount of the salt compound in the developing solution may be preferably in the range of 0.01 to 1 mol/liter from the aspect of improving image-forming properties, more preferably 0.05 to 0.5 mol/liter, in terms of the alkali metal and/or ammonium cation.

The present invention exhibits excellent effects by the use of the developing solution comprising the above components (a) and (b) in processing of the heat-sensitive PS plate of a positive-working mode comprising an image forming layer with a laminated structure.

More specifically, the addition of an alkali metal salt and/or an ammonium cation salt into a developing solution improve solubility of light-exposed portion of the upper layer, which results in improvement of image contrast. On the other hand, the addition of an anionic surfactant and/or an ampholytic surfactant improve solubility of light-exposed portion of the lower layer, which results in improvement of image contrast. Consequently, the combination use of components (a) and (b) can remarkably improve the image contrast in the heat-sensitive PS plate of a positive-working mode comprising an image forming layer with a laminated structure.

Further, it is desirable to select a ratio of the amount of component (a) to the amount of component (b) in the developing solution. Since the addition of component (a) accelerates a dissolution velocity of light-exposed portion of the lower layer and the addition of component (b) accelerates a dissolution velocity of light-exposed portion of the upper layer, the ratio between the amounts of components (a) and (b) in the developing solution can be selected to optimize the balance of dissolution velocity of the lower and upper layers and improve the image contrast, in particular the small dot reproducibility greatly.

The ratio of the amount of at least one selected from an anionic surfactant and an ampholytic surfactant in terms of A (gram/liter) to the amount of at least one selected from an alkali metal and an ammonium cation in terms of B (mol/liter) in the developing solution, which is expressed as A/B is suitably in the range of from 0.01 to 100, and more preferably from 0.1 to 50.

The developing solution for use in the present invention may further comprise various additives as shown below in order to enhance the development performance more effectively.

The additives include, for example, a chelating agent such as EDTA and NTA as disclosed in JP KOKAI No. Sho 58-190952; a complex such as $[Co(NH_3)_6]Cl_3$ and $CoCl_2.6H_2O$ as disclosed in JP KOKAI No. Sho 59-121336; a nonionic surfactant such as tetramethyldecyne diol as disclosed in U.S. Pat. No. 4,374,920; a cationic polymer such as methyl chloride quaternary compounds of p-dimethylaminomethyl polystyrene as disclosed in JP KOKAI No. Sho 55-95946; a polymeric ampholyte such as a copolymer of vinylbenzyltrimethylammonium chloride and sodium acrylate as disclosed in JP KOKAI No. Sho 56-142528; a reducing inorganic salt such as sodium sulfite as disclosed in JP KOKAI No. Sho 57-192951; an organic metal containing surfactant such as surfactants containing organic silicon or titanium as disclosed in JP KOKAI No. Sho 59-75255; an organic boron compound as disclosed in JP KOKAI No. Sho 59-84241; and a quaternary ammonium salt such as tetraalkylammonium oxide as disclosed in EP 101,010.

Preferably, the developing solution for use in the present invention may have a surface tension of 65 dyne/cm or less, more preferably 60 dyne/cm or less. The surface tension of the developing solution can be measured, for example, by the oscillating jet method. The instrument for measuring the surface tension includes an automatic dynamic surface tension meter of oscillating jet type.

The embodiment where the alkaline developing solution for use in the present invention is employed is not particularly limited. To rationalize and standardize the process of making a printing plate in the fields of plate making and printing, automatic processors have widely been used to produce printing plates in recent years. Typically, the automatic processor comprises a development unit and a post-treatment unit, including an apparatus for transporting a PS plate, containers for various kinds of treatment liquids, and apparatuses for spraying the liquids onto the PS plate. While the PS plate that has been exposed to light image is horizontally transported in the automatic processor, each treatment liquid is drawn up from the container using a pump and sprayed onto the PS plate through the spray nozzle, thereby achieving the development. There is also known a method of treating the PS plate by immersing the PS plate in a treatment liquid held in the container while transporting the PS plate along a guide roll provided in the container. In the case where the PS plate is developed by immersing the plate into the treatment liquid, it is preferable to uniformly supply the PS plate with the development solution. Preferably, the developing solution may be supplied to the surface of the PS plate at a rate of 0.5 to 10 ml/sec·cm$^2$. The rate of the developing solution to be applied to the surface of the PS plate can be determined by controlling the transporting speed of the PS plate and the amount of developing solution supplied the developer-supply means. The developer-supply means includes a spraying apparatus, a circulating pump for causing convention of liquid, and the like.

Such an automatic processor can achieve continuous development operation by replenishing the treatment liquids in respective containers according to the amount consumed and the operating time. In this case, large quantities of PS plates can be treated without any replacement of the developing solution in a developer container over a long period of time by adding to the developing solution a replenisher controlled to have an alkalinity higher than that of the developing solution. In the embodiments where the alkaline developing solution for use in the present invention is employed, the above-mentioned replenishing system is preferably used. Basically, the replenisher may have the same formulation as that of the alkaline developing solution mentioned above.

The aforementioned developing solution and replenisher therefor may further comprise other surfactants than those mentioned above and organic solvents, if necessary, in order to appropriately control the developing performance, enhance the dispersion properties of sludge in the developing solution, and increase the ink receptivity of the image portion to be formed in the printing plate. Benzyl alcohol or the like is preferred as the above-mentioned organic solvent. In addition, it is also preferable to add polyethylene glycol or derivatives thereof, and polypropylene glycol or derivatives thereof.

Furthermore, when necessary, the developing solution and replenisher may comprise hydroquinone, resorcin, an inorganic salt type reducing agent such as sodium sulfite or hydrogensulfite and potassium sulfite or hydrogensulfite, an organic carboxylic acid, an antifoaming agent, and a water softener.

Not only the above-mentioned development process, but also the development process using only a substantially fresh developing solution, that is, a throwaway developing solution, can be applied to the method of making a printing plate according to the present invention.

The PS plate for lithographic printing which has finished the development treatment using the above-mentioned alkaline developing solution is then subjected to the post-treatment. The PS plate is subjected to the post-treatment with washing water, a rinsing solution containing a surfactant, and a desensitizing solution comprising gum arabic and starch derivatives. Such liquids as conventionally known can be used in combination in the post-treatment.

The heat-sensitive PS plate of a positive-working mode for lithographic printing for use in the present invention, and the components constituting the PS plate will now be explained in detail.

The PS plate for lithographic printing that is used for the plate making method of the present invention comprises a substrate and a heat-sensitive image forming layer formed on the substrate, the heat-sensitive image forming layer comprising a lower layer and a heat-sensitive upper layer which are successively overlaid on the substrate in this order, wherein the lower layer comprises a water-insoluble and alkali-soluble resin and the heat-sensitive upper layer comprises a water-insoluble and alkali-soluble resin and an infrared absorption dye and exhibits an elevated solubility with respect to alkaline aqueous solutions when heated. Namely, the heat-sensitive upper layer comprising an alkali-soluble resin and an infrared absorption dye is disposed at the surface portion that is subjected to light exposure, and the lower layer comprising an alkali-soluble resin is disposed at a portion adjacent to the substrate. Examples of such a PS plate having a multi-layered heat-sensitive image forming layer are disclosed in JP KOKAI No. 2001-166477 and JP KOKAI No. Hei 11-218914.

[Alkali-Soluble Resin]

In the present invention, the water-insoluble and alkali-soluble resin contained in the heat-sensitive upper layer and the lower layer means a polymeric compound that is insoluble in water and soluble in alkaline solutions, which will also be referred to as an alkali-soluble polymer hereinafter. The alkali-soluble polymer includes homopolymers having an acidic group in the main chain and/or side chain thereof, and copolymers or mixtures thereof. Therefore, one of the features of the upper heat-sensitive layer and the lower layer is that those layers are dissolved in the alkaline developing solution when come in contact therewith.

Any conventional alkali-soluble polymers can be used in the present invention. It is preferable that the employed polymers have in the molecule thereof at least one functional group selected from the group consisting of: (1) phenolic hydroxyl group, (2) sulfonamide group, and (3) active imide group.

The following polymers can be given as examples, but the alkali-soluble polymer for use in the present invention is not limited to the following examples.

(1) Examples of the alkali-soluble polymers having a phenolic hydroxyl group are as follows: novolak resins such as phenol—formaldehyde resin, m-cresol—formaldehyde resin, p-cresol—formaldehyde resin, (mixture of m-cresol and p-cresol)—formaldehyde resin, and mixture of phenol and cresol (m-cresol and/or p-cresol)—formaldehyde resin; and pyrogallolacetone resins. In addition to the above alkali-soluble polymers having a phenolic hydroxyl group, polymers having a phenolic hydroxyl group in the side chain thereof are preferably used. Such polymers having a phenolic hydroxyl group in the side chain thereof can be obtained by homopolymerization of a polymerizable monomer which is composed of a low-molecular compound comprising at least one phenolic hydroxyl group and at least one polymerizable unsaturated bond, or copolymerization of the above-mentioned monomer with other polymerizable monomers.

Examples of the polymerizable monomer having a phenolic hydroxyl group used to obtain the polymers having a phenolic hydroxyl group in the side chain thereof include phenolic hydroxyl group-containing acrylamide, methacrylamide, acrylic ester, methacrylic ester, and hydroxystyrene. Specific examples of the above-mentioned polymerizable monomer include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate.

The above-mentioned phenolic hydroxyl group-containing resins may be used alone or in combination. Moreover, condensation polymers of phenol having as a substituent an alkyl group with 3 to 8 carbon atoms and formaldehyde, such as t-butylphenol—formaldehyde resin and octylphenol—formaldehyde resin may be used together, as disclosed in U.S. Pat. No. 4,123,279.

(2) The alkali-soluble polymers having a sulfonamide group include polymers obtained by homopolymerization of a sulfonamide group-containing polymerizable monomer or copolymerization of the above polymerizable monomer and other polymerizable monomers. The sulfonamide group-containing polymerizable monomer is composed of a low-molecular compound having in one molecule thereof at least (i) one sulfonamide group (—NH—$SO_2$) wherein at least one hydrogen atom is bonded to nitrogen atom, and (ii) at least one polymerizable unsaturated bond. In particular, low-molecular compounds having acryloyl group, allyl group or vinyloxy group, and substituted- or monosubstituted-aminosulfonyl group or substituted-sulfonylimino group are preferably used.

(3) With respect to the active imide group-containing alkali-soluble polymers, polymers having an active imide group in the molecule thereof are preferable. Such polymers can be obtained by homopolymerization of a polymerizable monomer which is composed of a low-molecular compound having in the molecule thereof one or more active imide groups and one or more polymerizable unsaturated bonds, or copolymerization of the above-mentioned monomer with other polymerizable monomers.

Preferable examples of the active imide group-containing polymers are N-(p-toluenesulfonyl)methacrylamide and N-(p-toluenesulfonyl)acrylamide.

Moreover, preferably employed are polymers obtained by polymerizing two or more polymerizable monomers selected from the group consisting of the above-mentioned phenol group-containing polymerizable monomers, sulfonamide group-containing polymerizable monomers, and active imide group-containing polymerizable monomers, and polymers obtained by subjecting the above-mentioned two or more polymerizable monomers to copolymerization with other polymerizable monomers.

In the case where the phenol group-containing polymerizable monomer (M1) is subjected to copolymerization with the sulfonamide group-containing polymerizable monomer (M2) and/or the active imide group-containing polymerizable monomer (M3), the ratio by weight of M1 to M2 and/or M3 is preferably in the range of (50:50) to (5:95), more preferably in the range of (40:60) to (10:90).

In the case where the alkali-soluble polymer is a copolymer consisting of one monomer unit selected from the above-mentioned monomers having acidic groups such as (1) phenol group, (2) sulfonamide group, and (3) active imide group and another monomer unit of other polymerizable monomers, it is preferable that the former monomer unit be contained in an amount of 10 mol % or more from the aspect of obtaining sufficient alkali-solubility to expand development latitude, more preferably 20 mol % or more, in the obtained copolymer.

Conventionally known graft copolymerization method, block copolymerization method, random copolymerization method and the like can be employed for synthesis of the above-mentioned copolymers.

The monomer components that can be used for copolymerization with the above-mentioned polymerizable phenolic hydroxyl group-containing monomers, sulfonamide group-containing monomers, and active imide group-containing monomers are classified into the following groups (m1) to (m12). However, the monomer components are not limited to the following examples.

(m1): Acrylic esters and methacrylic esters having an aliphatic hydroxyl group, such as 2-hydroxyethyl acrylate and 2-hydroxyethyl methacrylate.

(m2): Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3): Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4): Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5): Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6): Vinyl esters such as vinyl acetate, vinyl chloroacetate, vinyl butyrate, and vinyl benzoate.

(m7): Styrenes such as styrene, $\alpha$-methylstyrene, methylstyrene, and chloromethylstyrene.

(m8): Vinyl ketones such as methyl vinyl ketone, ethyl vinyl ketone, propyl vinyl ketone, and phenyl vinyl ketone.

(m9): Olefins such as ethylene, propylene, isobutylene, butadiene, and isoprene.

(m10): N-vinylpyrrolidone, acrylonitrile, and methacrylonitrile.

(m11): Unsaturated imides such as maleimide, N-acryloylacrylamide, N-acetylmethacrylamide, N-propionylmethacrylamide, and N-(p-chlorobenzoyl)methacrylamide.

(m12): Unsaturated carboxylic acids such as acrylic acid, methacrylic acid, maleic anhydride, and itaconic acid.

In the case where the alkali-soluble polymer for use in the present invention is a homopolymer of the above-mentioned phenolic hydroxyl group-containing polymerizable monomer, sulfonamide group-containing polymerizable monomer, or active imide group-containing polymerizable monomer, or a copolymer comprising the above-mentioned polymerizable monomer, the weight-average molecular weight (Mw) of the obtained polymer may be preferably 2,000 or more, more preferably in the range of 5,000 to 300,000, and the number-average molecular weight (Mn) of the obtained polymer may be preferably 500 or more, more preferably in the range of 800 to 250,000. The polydispersity (Mw/Mn) is desirably in the range of 1.1 to 10.

In the case where the alkali-soluble polymer is a resin such as phenol— formaldehyde resin, cresol—aldehyde resin or the like, the polymer with a weight-average molecular weight of 500 to 20,000 and a number-average molecular weight of 200 to 10,000 is preferably used.

One kind of alkali-soluble polymer may be used alone in the upper heat-sensitive layer, or two or more polymers may be used in combination. The upper heat-sensitive layer is required to cause strong hydrogen bonding at the non-exposed portion, and to readily and selectively release the hydrogen bond when exposed to light. In consideration of this, the phenolic hydroxyl group-containing resin is preferably used for the upper heat-sensitive layer, and in particular, the novolak type resin is more preferable in the present invention.

In the lower layer, the above-mentioned alkali-soluble polymers may be used alone or in combination. Among the above polymers, preferably used are acrylic resins, in particular, acrylic resins having sulfonamide group. Such acrylic resins may be used alone or in combination.

In the upper heat-sensitive layer, the alkali-soluble polymer may be contained in an amount of 50 to 90% by weight from the aspect of durability and sensitivity of the heat-sensitive layer.

In addition, two or more alkali-soluble polymers with different solution velocities with respect to an alkaline aqueous solution may be used at an arbitrary mixing ratio in the upper heat-sensitive layer.

Preferably, in the upper heat-sensitive layer, the phenolic hydroxyl group-containing alkali-soluble polymer may be used in an amount of 60 to 99.8% by weight with respect to the total weight of the entire alkali-soluble polymers for use in the upper heat-sensitive layer. This is because the phenolic hydroxyl group-containing polymer is characterized in that strong hydrogen bonding can take place at the non-exposed portion, and pat of the hydrogen bond is readily released when exposed to light as mentioned above.

[Infrared Absorption Dye]

In the heat-sensitive PS plate for lithographic printing for use in the present invention, the kind of infrared absorption dye used in the heat-sensitive image forming layer is not particularly limited so long as the infrared absorption dye can absorb infrared radiation to generate heat. A variety of dyes known as the infrared absorption dyes can be used.

There can be employed commercially available infrared absorption dyes and conventional ones described in references, for example, "Senryo Binran" published in 1970, by The Society of Synthetic Organic Chemistry, Japan. Examples of the infrared absorption dyes include azo dyes, metal complex salt azo dyes, pyrazolone azo dyes, anthraquinone dyes, phthalocyanine dyes, carbonium dyes, quinoneimine dyes, methine dyes, and cyanine dyes.

Particularly preferable are infrared or near infrared absorption dyes because of an advantage in their suitability for using with infrared or near infrared radiation laser beams as the means for light exposure.

Specific examples of the infrared or near infrared absorption dyes are as follows: cyanine dyes disclosed in JP KOKAI Nos. Sho 58-125246, 59-84356, 59-202829 and 60-78787; methine dyes disclosed in JP KOKAI Nos. Sho 58-173696, 58-181690 and 58-194595; naphthoquinone dyes disclosed in JP KOKAI Nos. Sho 58-112793, 58-224793, 59-48187, 59-73996, 60-52940 and 60-63744; squarylium dyes disclosed in JP KOKAI No. Sho 58-112792; and cyanine dyes disclosed in British Patent No. 434,875.

In addition, near infrared absorption sensitizers disclosed in U.S. Pat. No. 5,156,938; arylbenzo(thio)pyrylium salts disclosed in U.S. Pat. No. 3,881,924; trimethine thiapyrylium salts disclosed in JP KOKAI No. Sho 57-142645 (U.S. Pat. No. 4,327,169); pyrylium compounds disclosed in JP KOKAI Nos. Sho 58-181051, 58-220143, 59-41363, 59-84248, 59-84249, 59-146063 and 59-146061; cyanine dyes disclosed in JP KOKAI No. Sho 59- 216146; pentamethine thiopyrylium salts disclosed in U.S. Pat. No. 4,283,475; pyrylium compounds disclosed in JP KOKOKU Nos. Hei 5-13514 and 5-19702 (JP KOKOKU herein means Japanese patent publication for opposition purpose); and commercially available products "Epolight III-178", "Epolight III-130" and "Epolight III-125" (trade names) made by Epolin, Inc., are preferably used as the infrared absorption dyes in the present invention.

Another examples of the dyes especially preferred in the present invention are near infrared absorption dyes described in U.S. Pat. No. 4,756,993, which dyes are represented by formulas (I) and (II) in the specification.

The above-mentioned infrared absorption dyes can be contained not only in the upper heat-sensitive layer, but also in the lower layer. Addition of the infrared absorption dye to the lower layer allows the lower layer to function as a heat-sensitive layer. In the case where the infrared absorption 0 dye is added to the lower layer, the dye for the lower layer may be the same as that used in the upper heat-sensitive layer or different therefrom.

Such an infrared absorption dye and other components may be contained together in one heat-sensitive layer, or an infrared absorption dye-containing layer may be provided separately. In the case where the infrared absorption dye-containing layer is provided separately, it is desirable to dispose the infrared absorption dye-containing layer adjacent to the heat-sensitive layer. It is preferable that such a dye and the above-mentioned alkali-soluble resin be contained in the same layer, although it is possible to add a dye and an alkali-soluble resin to the respective layers.

When the infrared absorption dye is added to the upper heat-sensitive layer, the dye may be contained in an amount of 0.01 to 50% by weight from the aspect of sensitivity and durability of the upper heat-sensitive layer, preferably 0.1 to 30% by weight, and more preferably 1.0 to 30% by weight, with respect to the total solid content of the image forming material for use in the upper heat-sensitive layer of the PS plate.

In the case of the lower layer, the dye may be contained in an amount of 0 to 20% by weight, preferably 0 to 10% by weight, and more preferably 0 to 5% by weight, with respect to the total solid content of the image forming material for use in the lower layer of the PS plate. Although the addition of the infrared absorption dye to the lower layer lowers the solubility of the image forming material for use in the lower layer in the alkaline developing solution, an increase in solubility of the image forming material for use in the lower layer in the developing solution can be expected after light exposure. However, an increase in the solubility resulting from the irradiation of light at the step of light exposure cannot be observed around the area of the lower layer adjacent to the substrate, that is, the area within a distance of 0.2 to 0.3 μm from the substrate. Namely, the decrease in solubility of the lower layer caused by the addition of the infrared absorption dye may become a factor to lower the sensitivity. In light of this, it is not desirable that the infrared absorption dye be added to the lower layer in such an amount that will decrease the solubility velocity of the lower layer to less than 30 nm.

[Other Additives]

For the formation of the lower layer, a variety of additives may be used if necessary, in addition to the above-mentioned essential component so as not to impair the effects of the present invention. Similarly, various additives may be contained in the upper heat-sensitive layer in addition to the essential components when necessary as long as the effects of the present invention are not impaired. Such additives may be contained only in the lower layer, or only in the upper heat-sensitive layer. Alternatively, both layers may comprise such additives. Examples of the additives for use in the present invention are as follows:

(1) Compounds Capable of Inhibiting the Solubility of Image Forming Material in Developing Solution In the heat-sensitive PS plate for lithographic printing for use in the present invention, the image forming layer may further comprise a variety of inhibitors that can inhibit the alkali-soluble polymer from easily dissolving in the developing solution.

The above-mentioned inhibitors are not particularly limited, and quaternary ammonium salts and polyethylene glycol compounds can be used.

The quaternary ammonium salts are not particularly limited, but include tetraalkyl ammonium salt, trialkylaryl ammonium salt, dialkyldiaryl ammonium salt, alkyltriaryl ammonium salt, tetraaryl ammonium salt, cyclic ammonium salt, and bicyclic ammonium salt.

Specific examples of the quaternary ammonium salts are tetrabutyl ammonium bromide, tetrapentyl ammonium bromide, tetrahexyl ammonium bromide, tetraoctyl ammonium bromide, tetralauryl ammonium bromide, tetraphenyl ammonium bromide, tetranaphthyl ammonium bromide, tetrabutyl ammonium chloride, tetrabutyl ammonium iodide, tetrastearyl ammonium bromide, lauryl trimethyl ammonium bromide, stearyl trimethyl ammonium bromide, behenyl trimethyl ammonium bromide, lauryl triethyl ammonium bromide, phenyl trimethyl ammonium bromide, 3-trifluoromethylphenyl trimethyl ammonium bromide, benzyl trimethyl ammonium bromide, dibenzyl dimethyl ammonium bromide, distearyl dimethyl ammonium bromide, tristearylmethyl ammonium bromide, benzyltriethyl ammonium bromide, hydroxyphenyl trimethyl ammonium bromide, and N-methylpyridinium bromide. In particular, quaternary ammonium salts described in JP Application Nos. 2001-226297, 2001-370059, and 2001-398047 are preferably used.

It is preferable that the quaternary ammonium salt serving as the above-mentioned inhibitor be contained in the image forming layer in an amount of 0.1 to 50% by weight from the aspect of sufficient inhibiting effect and no adverse effect on film-forming properties of binders, more preferably 1 to 30% by weight, in terms of the solid content with respect to the total weight of the solid content of the image forming layer.

The polyethylene glycol compound used as the aforementioned inhibitor is not particularly limited. The polyethylene glycol with the following structure is preferably employed in the present invention.

$$R^1—[—O—(R^3—O—)_m—R^2]_n$$

wherein $R^1$ is a residue of a polyhydric alcohol or polyhydric phenol; $R^2$ is a hydrogen atom, or an alkyl group, an alkenyl group, an alkynyl group, alkyloyl group, an aryl group, or an aryloyl group, which has 1 to 25 carbon atoms and may have a substituent; $R^3$ is a residue of an alkylene group which may have a substituent; m is 10 or more on average; and n is an integer of 1 to 4.

Examples of the polyethylene glycol compounds having the above-mentioned structure include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene glycol sorbitol esters, polypropylene glycol sorbitol esters, polyethylene glycol fatty acid esters, polypropylene glycol fatty acid esters, polyethylene glycol ethylenediamines, polypropylene glycol ethylenediamines, polyethylene glycol diethylenetriamines, and polypropylene glycol diethylenetriamines.

Specific examples of the above-mentioned polyethylene glycol compounds are polyethylene glycol 1000, polyethylene glycol 2000, polyethylene glycol 4000, polyethylene glycol 10000, polyethylene glycol 20000, polyethylene glycol 50000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic ester, polyethylene glycol lauryl ester, polyethylene glycol dilauryl ester, polyethylene glycol nonylic ester, polyethylene glycol cetylic ester, polyethylene glycol stearoyl ester, polyethylene glycol distearoyl ester, polyethylene glycol behenic ester, polyethylene glycol dibehenic ester, polypropylene glycol acetyl ester, polypropylene glycol diacetyl ester, polypropylene glycol benzoic ester, polypropylene glycol dibenzoic ester, polypropylene glycol lauryl ester, polypropylene glycol dilauryl ester, polypropylene glycol nonylic ester, polyethylene glycol glycerin ether, polypropylene glycol glycerin ether, polyethylene glycol sorbitol ether, polypropylene glycol sorbitol ether, polyethylene glycol ethylenediamine, polypropylene glycol ethylenediamine, polyethylene glycol diethylenetriamine, polypropylene glycol diethylenetriamine, and polyethylene glycol pentamethylenehexamine.

The amount of the polyethylene glycol compound may be in the range of 0.1 to 50% by weight from the aspect of sufficient inhibiting effect and no adverse effect on film-forming properties of binders, preferably 1 to 30% by weight, in terms of the solid content with respect to the total weight of the solid content for use in the image forming layer.

The decrease in sensitivity, which is caused when the solubility of the alkali-soluble polymer in the developing solution is inhibited as mentioned above, can effectively be avoided by the addition of a lactone compound. When the developing solution permeates through the light-exposed portion of the image forming layer, the lactone compound reacts with the developing solution to form a carboxylic acid compound, which will contribute to dissolving of the light-exposed portion of the image forming layer. Thus, the decrease in sensitivity can be prevented.

The lactone compound for use in the present invention is not particularly limited. For example, lactone compounds represented by the following formulas (L-I) and (L-II) can be used.

(L-I)

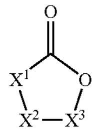

(L-II)

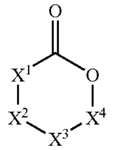

In the above formulas (L-I) and (L-II), $X^1$, $X^2$, $X^3$ and $X^4$ are each an atom or a group for forming a ring, which may be the same or different and independently have a substituent. At least one of $X^1$, $X^2$ or $X^3$ in the formula (L-I), and at least one of $X^1$, $X^2$, $X^3$ or $X^4$ in the formula (L-II) have an electron attractive substituent or a substituent having an electron attractive substituent.

The atoms or groups represented by $X^1$, $X^2$, $X^3$ and $X^4$ which constitute the ring are each a non-metallic atom having two single bonds or a group including the above-mentioned non-metallic atom for forming the ring.

Preferable non-metallic atoms and preferable groups including the non-metallic atoms are methylene group, sulfinyl group, carbonyl group, thiocarbonyl group, sulfonyl group, sulfur atom, oxygen atom, and selenium atom. In particular, methylene group, carbonyl group and sulfonyl group are preferably used.

As mentioned above, at least one of $X^1$, $X^2$ or $X^3$ in the formula (L-I), and at least one of $X^1$, $X^2$, $X^3$ or $X^4$ in the formula (L-II) have an electron attractive group. The electron attractive group herein used is a group where the Hammett's substituent constant represented by σ ρ is positive. For the Hammett's substituent constant, Journal of Medicinal Chemistry, 1973, vol. 16, No. 11, 1207-1216 can serve as a reference. Examples of the electron attractive group where the Hammett's substituent constant represented by σ ρ is a positive value include a halogen atom such as fluorine atom (σ ρ value of 0.06), chlorine atom (σ ρ value of 0.23), bromine atom (σ ρ value of 0.23) and iodine atom (σ ρ value of 0.18); trihaloalkyl group such as tribromomethyl group (σ ρ value of 0.29), trichloromethyl group (σ ρ value of 0.33) and trifluoromethyl group (σ ρ value of 0.54); cyano group (σρ value of 0.66); nitro group (σ ρ value of 0.78); aliphatic, aryl or heterocyclic sulfonyl group such as methanesulfonyl group (σ ρ value of 0.72); aliphatic, aryl or heterocyclic acyl group such as acetyl group (σ ρ value of 0.50) and benzoyl group (σ ρ value of 0.43); alkynyl group such as C≡CH group (σ ρ value of 0.23); aliphatic, aryl or heterocyclic oxycarbonyl group such as methoxycarbonyl group (σ ρ value of 0.45) and phenoxycarbonyl group (σ ρ value of 0.44); carbamoyl group (σ ρ value of 0.36); sulfamoyl group (σ ρ value of 0.57); sulfoxide group; heterocyclic group; oxo group; and phosphoryl group.

Preferable examples of the electron attractive groups are amide group, azo group, nitro group, fluoroalkyl group having 1 to 5 carbon atoms, nitrile group, alkoxycarbonyl group having 1 to 5 carbon atoms, acyl group having 1 to 5 carbon atoms, alkylsulfonyl group having 1 to 9 carbon atoms, arylsulfonyl group having 6 to 9 carbon atoms, alkylsulfinyl group having 1 to 9 carbon atoms, arylsulfinyl group having 6 to 9 carbon atoms, arylcarbonyl group having 6 to 9 carbon atoms, thiocarbonyl group, fluorine-containing alkyl group having 1 to 9 carbon atoms, fluorine-containing aryl group having 6 to 9 carbon atoms, fluorine-containing allyl group having 3 to 9 carbon atoms, oxo group, and halogen atoms.

Among the above groups, more preferably used are nitro group, fluoroalkyl group having 1 to 5 carbon atoms, nitrile group, alkoxycarbonyl group having 1 to 5 carbon atoms, acyl group having 1 to 5 carbon atoms, arylsulfonyl group having 6 to 9 carbon atoms, arylcarbonyl group having 6 to 9 carbon atoms, oxo group, and halogen atoms.

Specific examples of the compounds represented by formulas (L-I) and (L-II) are shown as follows. However, the lactone compounds for use in the present invention are not limited to the following examples.

(LI-1)

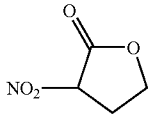

(LI-1)

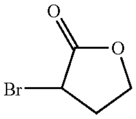

(LI-3)

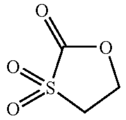

(LI-4)

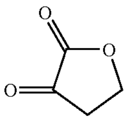

(LI-5)

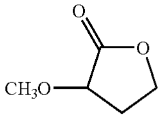

(LI-6)

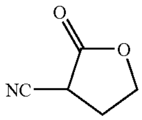

(LI-7)

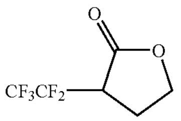

-continued
(LI-8)
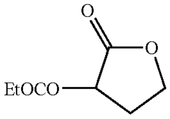
(LI-9)
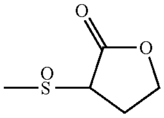
(LI-10)
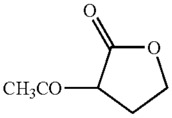
(LI-11)
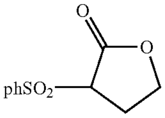
(LI-12)
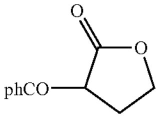
(LI-13)
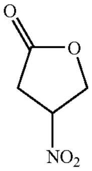
(LI-14)
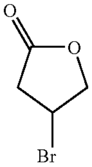
(LI-15)
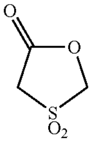
(LI-16)
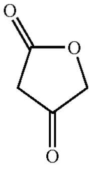
(LI-17)
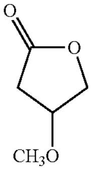
-continued
(LI-18)
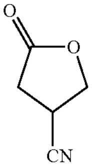
(LI-19)
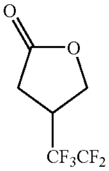
(LI-20)
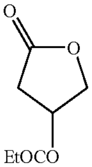
(LI-21)
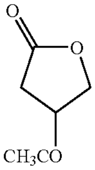
(LI-22)
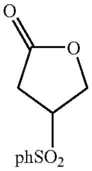
(LI-23)
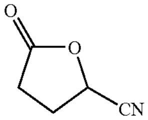
(LI-24)
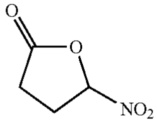
(LII-1)
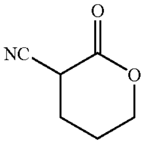
(LII-2)
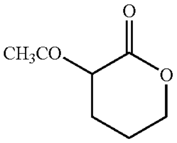
The lactone compound represented by formulas (L-I) and (L-II) may be contained in the image forming layer in an amount of 0.1 to 50% by weight from the aspect of satisfactory effect and image forming performance, preferably 1 to 30% by weight, in terms of the solid content with respect to the total weight of the solid content of the image forming layer. It is desirable that the lactone compound be selectively brought into contact with the developing solution to cause the reaction therewith.

The above-mentioned lactone compounds may be used alone or in combination. Further, two or more kinds of lactone compounds having formula (L-I) and two or more kinds of lactone compounds having formula (L-II) may be used together at an arbitrary mixing ratio so that the total weight of the lactone compounds is within the above-mentioned range.

Moreover, to further effectively inhibit the non-light exposed portion of the image forming layer from unfavorably dissolving in the developing solution, it is also preferable to use materials which can be pyrolytically decomposed and can substantially decrease the solubility of the alkali-soluble polymer in the alkaline developing solution before pyrolytical decomposition. Such materials include onium salts, o-quinonediazide compounds, aromatic sulfone compounds, and aromatic sulfonic acid ester compounds,. The onium salts include diazonium salt, ammonium salt, phosphonium salt, iodonium salt, sulfonium salt, selenonium salt, arsonium salt and the like.

More specifically, preferable examples of the onium salts are diazonium salts described in S. I. Schlesinger, Photogr. Sci. Eng., 18, 387 (1974), T. S. Bal et al., Polymer, 21, 423 (1980), and JP KOKAI No. Hei 5-158230; ammonium salts described in U.S. Pat. Nos. 4,069,055 and 4,069,056, and JP KOKAI No. Hei 3-140140; phosphonium salts described in D. C. Necker et al., Macromolecules, 17, 2468 (1984), C. S. Wen et al., Teh, Proc. Conf. Rad. Curing ASIA, p478 Tokyo, October (1988), and U.S. Pat. Nos. 4,069,055 and 4,069,056; iodonium salts described in J. V. Crivello et al., Macromolecules, 10(6), 1307 (1977), Chem. & Eng. News, Nov. 28, p31 (1988), EP 104,143, U.S. Pat. Nos. 339,049 and 410,201, and JP KOKAI Nos. Hei 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP 370,693, EP 233,567, EP 297,443, EP 297,442, U.S. Pat. Nos. 4,933,377, 3,902,114, 410,201, 339,049, 4,760,013, 4,734,444 and 2,833,827, and DP Nos. 2,904,626, 3,604,580 and 3,604,581; selenonium salts described in J. V. Crivello et al., Macromolecules, 10(6), 1307 (1977), and J. V. Crivello et al., J. Polymer Sci., Polymer Chem. Ed., 17, 1047 (1979); and arsonium salts described in C. S. Wen et al., Teh, Proc. Conf Rad. Curing ASIA, p478 Tokyo, October (1988).

Of those onium salts, preferably used are diazonium salts, in particular, diazonium salts disclosed in JP KOKAI No. Hei 5-158230.

As the counter ions for the onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like can be employed. In particular, hexafluorophosphoric acid and alkyl aromatic sulfonic acid such as triisopropylnaphthalenesulfonic acid and 2,5-dimethylbenzenesulfonic acid are preferably used.

Suitable quinonediazide compounds for use in the present invention include o-quinonediazide compounds. The o-quinonediazide compound for use in the present invention is a compound having at least one o-quinonediazide group, which compound can exhibit increased alkali-solubility by pyrolysis. There can be employed o-quinonediazide compounds with various structures. The o-quinonediazide compounds herein used can contribute to the solubility characteristics of the image forming layer because the o-quinonediazide compounds have the characteristics that they lose the force to inhibit the binder agent from dissolving in the developing solution and the o-quinonediazide compounds themselves turns into alkali-soluble materials when thermally decomposed. For example, the o-quinonediazide compounds described in J. Kosar "Light-sensitive Systems" (John Wiley & Sons. Inc.) pp. 339–352 can be used in the present invention. In particular, sulfonic esters of o-quinonediazide compounds or sulfonamides obtained by the reaction with a variety of aromatic polyhydroxyl compounds or aromatic amino compounds are preferable. In addition, esters of benzoquinone-(1,2)-diazidesulfonic acid chloride or naphthoquinone-(1,2)-diazide-5-sulfonic acid chloride with pyrogallol-acetone resin as described in JP KOKOKU No. Sho 43-28403; and esters of benzoquinone-(1,2)-diazidesulfonic acid chloride or naphthoquinone-(1,2)-diazide-5-sulfonic acid chloride with phenol-formaldehyde resin as described in U.S. Pat. Nos. 3,046,120 and 3,188,210 are also preferably used in the present invention.

Similarly, esters of naphthoquinone-(1,2)-diazide-4-sulfonic acid chloride with phenol-formaldehyde resin or cresol-formaldehyde resin, and esters of naphthoquinone-(1,2)-diazide-4-sulfonic acid chloride with pyrogallol-acetone resin can also be preferably employed. Other suitable o-quinonediazide compounds are described in many patent specifications, for example, JP KOKAI Nos. Sho 47-5303, 48-63802, 48-63803, 48-96575, 49-38701 and 48-13354, JP KOKOKU Nos. Sho 41-11222, 45-9610 and 49-17481, U.S. Pat. Nos. 2,797,213, 3,454,400, 3,544,323, 3,573,917, 3,674,495 and 3,785,825, BP Nos. 1,227,602, 1,251,345, 1,267,005, 1,329,888 and 1,330,932, and DP No. 854,890.

It is preferable that the o-quinonediazide compound be contained in an amount of 1 to 50% by weight, more preferably 5 to 30% by weight, and most preferably 10 to 30% by weight, with respect to the total solid content of the image forming layer. The above-mentioned o-quinonediazide compounds may be used alone or in combination.

To more effectively inhibit the alkali-soluble polymer from dissolving in the developing solution, and at the same time, to impart the increased scratch resistance to the surface portion of the image forming layer, it is preferable that the image forming layer further comprise polymers including a (meth)acrylate monomer having two or three perfluoroalkyl groups with 3 to 20 carbon atoms in the molecule thereof, as described in JP KOKAI No. 2000-187318.

Such a polymer may be contained in an amount of 0.1 to 10% by weight, more preferably 0.5 to 5% by weight of the total weight of the image forming layer.

(2) Development Promoting Agent

The upper heat-sensitive layer and the lower layer of the PS plate may further comprise acid anhydrides, phenolics and organic acids to improve the sensitivity.

With respect to the acid anhydrides, cyclic acid anhydrides are preferable. More specifically, the cyclic acid anhydrides include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenyl maleic anhydride, succinic anhydride, and pyromellitic anhydride disclosed in U.S. Pat. No. 4,115,128. Non-cyclic acid anhydrides include acetic anhydride.

Examples of the phenolics for use in the present invention are bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

The organic acids include sulfonic acids, sulfinic acids, alkylsulfuric acids, phosphonic acids, phosphoric esters, and carboxylic acids as described in JP KOKAI Nos. Sho 60-88942 and Hei 2-96755. Specific examples of the organic acids are p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

It is preferable that the above-mentioned acid anhydrides, phenolics and organic acids be contained in an amount of 0.05 to 20% by weight, more preferably 0.1 to 15% by weight, and most preferably 0.1 to 10% by weight, with respect to the total weight of the image forming layer.

(3) Surfactant

The upper heat-sensitive layer and the lower layer may further comprise nonionic surfactants as described in JP KOKAI Nos. Sho 62-251740 and Hei 3-208514, ampholytic surfactants as described in JP KOKAI Nos. Sho 59-121044 and Hei 4-13149, siloxane compounds as described in EP 950,517, and copolymers comprising a fluorine-containing monomer as described in JP KOKAI Nos. Sho 62-170950 and Hei 11-288093 and JP Application No. 2001-247351 to upgrade the coating properties and ensure the stable operation depending upon the development conditions.

Specific examples of the nonionic surfactants are sorbitan tristearate, sorbitan monopalmitate, sorbitan trioleate, stearic acid monoglyceride, and polyoxyethylene nonylphenyl ether. Specific examples of the ampholytic surfactants are alkyldi(aminoethyl)glycine, alkylpolyaminoethylglycine hydrochloride, 2-alkyl-N-carboxyethyl-N-hydroxyethyl imidazolinium betaine, and N-tetradecyl-N,N-betaine (e.g., “Amogen” (trade name) made by Dai-Ichi Kogyo Seiyaku Co., Ltd.).

Block copolymers of dimethyl siloxane and polyalkylene oxide are preferably employed as the siloxane compounds. More specifically, commercially available polyalkylene oxide modified silicone products such as “DBE-224”, “DBE-621”, “DBE-712”, “DBP-732” and “DBP-534”, made by Chisso Corporation; and “Tego Glide 100” (trade name), made by Tego Chemie Service GmbH can preferably be employed in the present invention.

It is preferable that the amount of the above-mentioned nonionic surfactants and ampholytic surfactants be in the range of 0.01 to 15% by weight, more preferably 0.1 to 5% by weight, and most preferably 0.05 to 0.5% by weight, with respect to the total weight of the image forming layer.

(4) Printing-Out Agent/Coloring Agent

The upper heat-sensitive layer and the lower layer of the PS plate for use in the present invention may comprise a printing-out agent and a coloring agent for images such as a dye and a pigment to obtain visible images immediately after the image forming layer is heated by light exposure.

One of the representative examples of the printing-out agent is a combination of a compound capable of generating an acid when heated by light exposure and an organic dye capable of forming a salt together with the above-mentioned acid-generating compound. Examples of such a printing-out agent include the combination of o-naphthoquinonediazide-4-sulfonic acid halogenide with a salt-forming organic dye disclosed in JP KOKAI Nos. Sho 50-36209 and 53-8128, and the combination of a trihalomethyl compound with a salt-forming organic dye disclosed in JP KOKAI Nos. Sho 53-36223, 54-74728, 60-3626, 61-143748, 61-151644 and 63-58440. The above-mentioned trihalomethyl compound includes oxazole compounds and triazine compounds, both of which can exhibit excellent stability with time and produce clear printed-out images.

The coloring agent for forming image portions includes not only the above-mentioned salt-forming organic dyes, but also other dyes. Preferable dyes including the salt-forming organic dyes are classified into oil-soluble dyes and basic dyes. Specific examples of such dyes are Oil Yellow #101, Oil Yellow #103, Oil Pink #312, Oil Green BG, Oil Blue BOS, Oil Blue #603, Oil Black BY, Oil Black BS, and Oil Black T-505, which are made by Orient Chemical Industries, Ltd.; and Victoria Pure Blue, Crystal Violet Lactone, Crystal Violet (CI 42555), Methyl Violet (CI 42535), Ethyl Violet, Rhodamine B (CI 145170B), Malachite Green (CI 42000), and Methylene Blue (CI 52015). Dyes disclosed in JP KOKAI No. Sho 62-293247 are particularly preferable. Those dyes may be contained in an amount of 0.01 to 10% by weight, preferably 0.1 to 3% by weight, with respect to the total solid content of the image forming layer.

(5) Plasticizer

The upper heat-sensitive layer and the lower layer of the PS plate for use in the present invention may further comprise a plasticizer, if necessary, to impart the flexibility and other properties to the respective layers. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

(6) Wax

The upper heat-sensitive layer and the lower layer of the PS plate for use in the present invention may further comprise a compound for decreasing the coefficient of static friction of the surface so as to improve the scratch resistance. More specifically, compounds having a long-chain alkylcarboxylic ester as described in U.S. Pat. No. 6,117,913 and JP Application Nos. 2001-261627, 2002-032904 and 2002-165584 can be used as the wax.

Such a wax may be contained in an amount of 0.1 to 10% by weight, preferably 0.5 to 5% by weight, with respect to the total weight of the upper heat-sensitive layer or the lower layer.

Usually, to provide the upper heat-sensitive layer and the lower layer of the PS plate for lithographic printing, a coating liquid for forming each layer may be prepared by dissolving the above-mentioned components in a solvent, and the coating liquid for formation of the lower layer may be coated on a proper substrate, and the coating liquid for formation of the upper heat-sensitive layer may be coated on the resultant lower layer.

Examples of the solvent used to prepare the coating liquids for the upper heat-sensitive layer and the lower layer include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene. The solvents for use in the present invention are not limited to the above-mentioned examples. Those solvents may be used alone or in combination.

In selecting the solvents for preparation of the coating liquids, it is desirably considered as a rule to choose a solvent so that the solubility of the alkali-soluble polymer for use in the upper heat-sensitive layer in the solvent is different from that of the alkali-soluble polymer for use in the lower layer in the solvent. However, for the purpose of obtaining another function, a conscious choice to make both alkali-soluble polymers partially soluble in each other is possible when the solvent is selected.

The method for providing the upper heat-sensitive layer and the lower layer separately will now be explained. For example, the above-mentioned two layers can be provided separately by utilizing a difference between the solvent solubility of the copolymer for use in the lower layer and that of the alkali-soluble resin for use in the upper heat-sensitive layer. Alternatively, separation of the two layers can be achieved by removing the solvent component through rapid drying after the coating liquid for the upper heat-sensitive layer is applied to the lower layer. Those two methods will be described in detail, but the method for providing the two layers separately is not limited to those two methods.

In the former method, that is, the method of utilizing a difference between the solvent solubility of the copolymer for the lower layer and that of the alkali-soluble resin for the upper heat-sensitive layer, a solvent system in which a particular copolymer and other copolymers used together for the formation of the lower layer are not soluble is employed for preparation of the coating liquid for the upper heat-sensitive layer containing an alkali-soluble resin. By selecting such a solvent for providing the upper heat-sensitive layer, the lower layer and the upper heat-sensitive layer can completely be separated from each other even though both layers are provided by coating. For example, a particular monomer is chosen to determine a copolymer comprising the above-mentioned monomer for forming the lower layer on the precondition that the monomer is insoluble in a solvent (e.g., methyl ethyl ketone and 1-methoxy-2-propanol) which is used to prepare a coating liquid for the upper heat-sensitive layer by dissolving an alkali-soluble resin for the upper heat-sensitive therein. Using a solvent capable of dissolving the above-mentioned copolymer for use in the lower layer, a coating liquid for forming the lower layer is prepared by dissolving the above-mentioned copolymer in the solvent, and coated on a substrate and dried. After that, a coating liquid for the upper heat-sensitive layer comprising the alkali-soluble resin is prepared using the solvent such as methyl ethyl ketone or 1-methoxy-2-propanol, and coated on the lower layer. Those two layers can thus be provided separately.

The latter method of quickly drying the coating liquid for the upper heat-sensitive layer after coating can be achieved by blowing high-pressure air on the surface of a web from a slit nozzle disposed substantially perpendicularly to the web coating direction, or causing the web to pass over a heating roll which is charged with a heating medium such as steam in order to impart the heat energy to the web by conduction, or using the above-mentioned two means in combination.

The upper heat-sensitive layer and the lower layer may be partially soluble in each other to such an extent that each layer can exhibit its own function in the present invention, as mentioned above. This can be achieved by delicate control in any of the above-mentioned two methods.

The coating liquid for formation of the each layer may be prepared by dissolving the components into an appropriate solvent. The concentration of the entire solid content of the components including the additives in the solvent may be preferably in the range of 1 to 50% by weight. Various coating methods, for example, bar coater coating, spin coating, spray coating, curtain coating, dip coating, air knife coating, blade coating and roll coating can be employed.

It is desirable that the coating liquid for the upper heat-sensitive layer be applied to the lower layer by non-contact coating method not to cause damage to the lower layer during the coating operation for the upper heat-sensitive layer. If a contact coating method is employed, the bar coater method generally used in the solution coating may be feasible, but in this case, coating in the forward direction is desirable in light of the prevention of the damage to the lower layer.

The coating liquid for formation of the lower layer may preferably be applied to the substrate for use in the PS plate with a deposition amount ranging from 0.5 to 4.0 $g/m^2$ from the aspect of the printing durability, the image reproducibility and the sensitivity, and more preferably from 0.6 to 2.5 $g/m^2$.

The coating liquid for forming the upper heat-sensitive layer may preferably be applied to the lower layer with a deposition amount ranging from 0.05 to 1.0 $g/m^2$ from the aspect of the latitude for development, the scratch resistance and the sensitivity, and more preferably from 0.08 to 0.7 $g/m^2$.

The deposition amounts of the lower layer and the upper heat-sensitive layer may be within the range of 0.6 to 4.0 $g/m^2$ from the aspect of the printing durability, the image reproducibility and the sensitivity, and more preferably from 0.7 to 2.5 $g/m^2$ in total.

[Substrate]

In the heat-sensitive PS plate for lithographic printing for use in the present invention, any dimensionally stable plate-shaped materials with a required strength and durability can be used as the hydrophilic substrate. Preferably used are a sheet of paper; a laminated sheet prepared by covering paper with a thin layer of plastic, such as polyethylene, polypropylene or polystyrene; a metal plate made of, for example, aluminum, zinc or copper; a plastic film made of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal; and a sheet of paper or plastic film to which the above-mentioned metals are attached or deposited.

A polyester film and an aluminum plate are particularly preferable as the substrate for the PS plate in the present invention. In particular, the aluminum plate is most preferable because the dimensional stability is excellent and the cost is relatively low.

Aluminum plates substantially composed of pure aluminum or an aluminum alloy containing a trace amount of elements other than aluminum are suitable. In addition, plastic sheets to which the aluminum plate is attached or the aluminum is deposited are also preferable. Examples of the above-mentioned elements used in the aluminum alloys are silicon, iron, manganese, copper, magnesium, chromium, zinc, bismuth, nickel and titanium. The content of such elements for use in the aluminum alloy is at most 10% by weight.

Although the pure aluminum plates are particularly preferable for the substrate, production of perfectly pure aluminum is difficult from the viewpoint of the refining technique, so that a trace amount of different elements may be contained. In such a way, the composition of the aluminum plate is not particularly limited, and conventional aluminum plates may be appropriately used for the substrate of the PS plate in the present invention. The thickness of the aluminum plate serving as the substrate is within the range from about 0.1 to about 0.6 mm, preferably 0.15 to 0.4 mm, and more preferably 0.2 to 0.3 mm.

The aluminum plate may be first subjected to degreasing, if required, prior to the surface roughening treatment, using a surfactant, an organic solvent, or an aqueous alkaline solution to remove rolling oil from the surface of the aluminum plate.

To provide the aluminum plate with a grained surface, there can be used various methods, for example, a method of mechanically roughening the surface of the aluminum plate, a method of electrochemically dissolving the surface of the aluminum plate, and a method of chemically dissolving the selected portions of the aluminum plate surface. The mechanical graining includes conventional processes, such as ball graining, brush graining, blast graining, and buffing graining. The electrochemical graining can be carried out in an electrolytic solution such as a hydrochloric acid or nitric acid solution by the application of a direct current or alternating current. Moreover, the above-mentioned mechanical graining and electrochemical graining may be used in combination as disclosed in JP KOKAI No. Sho 54-63902.

The surface-grained aluminum plate thus obtained may be subjected to alkali etching, followed by neutralization. After that, an anodized film may usually be provided on the aluminum plate by anodization to improve the water retention properties and wear resistance.

Any material can be used as an electrolyte in the anodization of the aluminum plate so long as a porous anodized film can be formed on the surface of the aluminum plate. Typically, sulfuric acid, phosphoric acid, oxalic acid, chromic acid, and mixtures thereof are used as the electrolyte. The concentration of the electrolyte is appropriately determined depending upon the kind of electrolyte.

The operating conditions for the anodization cannot be particularly specified because they depend on the type of electrolyte. In general, it is proper that the concentration of the electrolyte be in the range of 1 to 80% by weight, the liquid temperature be controlled to 5 to 70° C., the current density be in the range of 5 to 60 $A/dM^2$, the applied voltage be in the range of 1 to 100 V, and the time for electrolysis be in the range of 10 seconds to 5 minutes. The deposition amount of the anodized film is suitably 1.0 $g/m^2$ or more, in the light of the sufficient printing durability, and prevention of toning by scratches on non-image areas.

After completion of the anodization, the surface of the aluminum plate may be made hydrophilic, if required. To make the aluminum surface hydrophilic, there can be employed an alkali metal silicate treatment (for example, using an aqueous solution of sodium silicate) as disclosed in U.S. Pat. Nos. 2,714,066, 3,181,461, 3,280,734 and 3,902,734. In such a silicate treatment, the aluminum substrate is immersed in an aqueous solution of sodium silicate or subjected to electrolysis therein. In addition to the silicate treatment, there can be employed other treatments using potassium fluorozirconate disclosed in JP KOKOKU No. Sho 36-22063 and polyvinylphosphonic acid disclosed in U.S. Pat. Nos. 3,276,868, 4,153,461, and 4,689,272.

The heat-sensitive PS plate for lithographic printing of positive-working mode for use in the present invention comprises a substrate and an image forming layer formed thereon, the image forming layer comprising at least two layers, that is, the above-mentioned lower layer and upper heat-sensitive positive-working mode layer which are successively provided on the substrate in this order. When necessary, the PS plate may further comprise an undercoating layer which is interposed between the substrate and the lower layer.

A variety of organic compounds can be used for formation of the undercoating layer. Examples of such organic compounds include carboxymeihyl cellulose; dextrin; gum arabic; organic phosphonic acids such as amino group-containing phosphonic acid (e.g., 2-aminoethyl phosphonic acid), phenylphosphonic acid which may have a substituent, naphthylphosphonic acid, alkylphosphonic acid, glycerophosphonic acid, methylenediphosphonic acid, and ethylenediphosphonic acid; organic phosphoric acids such as phenylphosphoric acid which may have a substituent, naphthylphosphoric acid, alkylphosphoric acid, and glycerophosphoric acid; organic phosphinic acids such as phenylphosphinic acid which may have a substituent, naphthylphosphinic acid, alkylphosphinic acid and glycerophosphinic acid; amino acids such as glycine and β-alanine; and hydrochlorides of hydroxyl group-containing amine, such as hydrochloride of triethanolamine. Those compounds may be used in combination.

The organic undercoating layer can be provided by the following methods. The above-mentioned organic compound is dissolved in water or organic solvents such as methanol, ethanol, and methyl ethyl ketone, or a mixture of such solvents to prepare a coating liquid for forming the undercoating layer. The coating liquid thus prepared is coated on the aluminum plate and then dried, so that an undercoating layer can be provided on the aluminum substrate. Alternatively, an aluminum plate is immersed in the solution prepared by dissolving the above-mentioned organic compound in water or organic solvents such as methanol, ethanol, and methyl ethyl ketone, or a mixture of such solvents to cause the aluminum plate to absorb the compound. Thereafter, the coated surface is washed with water and dried, thereby obtaining an organic undercoating layer on the aluminum substrate. In the former method for providing the undercoating layer, the coating liquid containing the above-mentioned organic compound at concentrations ranging from 0.005 to 10% by weight can be applied to a variety of coating methods. In the latter method, the concentration of the organic compound in the coating liquid is preferably in the range of 0.01 to 20% by weight, more preferably in the range of 0.05 to 5% by weight. The aluminum plate may be immersed in the solution of 20 to 90° C., preferably 25 to 50° C., for 0.1 sec to 20 min, preferably 2 sec to 1 min. The coating liquid used to form the undercoating layer may be controlled to pH 1 to 12 by the addition of basic materials such as ammonia, triethylamine, potassium hydroxide and the like, or acidic materials such as hydrochloric acid, phosphoric acid and the like. Furthermore, the coating liquid for the undercoating layer may further comprise a yellow dye to improve the tone reproduction of the image forming layer to be formed on the undercoating layer.

It is proper that the deposition amount of the undercoating layer be in the range of 2 to 200 mg/$m^2$ from the aspect of sufficient printing durability, and preferably in the range of 5 to 100 mg/$m^2$.

The heat-sensitive PS plate for lithographic printing thus fabricated is exposed to light images and thereafter subjected to development using the previously mentioned alkaline developing solution.

The light source capable of emitting the active light for achieving the light exposure includes, for example, mercury lamp, metal halide lamp, xenon lamp, chemical lamp, and carbon arc lamp. The radiation includes electron beam, X-ray, ion beam, and far infrared ray, and the like. Further, g-line, i-line, deep-UV and high-density energy beam (laser beam) are also used. The laser beam includes helium-neon laser, argon laser, krypton laser, helium-cadmium laser, KrF excimer laser, and the like. In the present invention, the light sources for emitting the light of wavelengths within the range from the near infrared to infrared region are preferred. In particular, solid laser and semiconductor laser are preferable in the present invention.

After completion of the development, the PS plate is subjected to water washing and/or rinsing and/or gumming up. In the case where the resultant PS plate bears an image portion that needs deleting, such as an edge portion of the original film, the unnecessary image portion may be deleted by, for example, applying a correction fluid as described in JP KOKOKU No. Hei 2-13293 to the unnecessary image portion and washing the portion with water after a predetermined period of time. Although the above-mentioned method is preferable, another method as described in JP KOKAI No. Sho 59-174842 can also be employed, by which method the active light guided along an optical fiber is applied to the unnecessary image portion, followed by development.

The lithographic printing plate can thus be prepared according to the method of the present invention. A desensitizing gum may be coated on the printing plate, if necessary, before printing operation. When the printing plate is required to have higher printing durability, the printing plate may be subjected to a burning treatment. In this case, it is desirable to treat the printing plate with a liquid for counter-etching as described in JP KOKOKU Nos. Sho 61-2518 and 55-28062, and JP KOKAI Nos. Sho 62-31859 and 61-159655 prior to the burning treatment.

For the treatment of the printing plate with a counter-etch solution, the counter-etch solution may be coated on the printing plate using a sponge or absorbent cotton dampened with the counter-etch solution, or the printing plate may be immersed in the counter-etch solution held in a vat. Further, an automatic coater may be used. After completion of the coating, the coating amount may be made uniform by using a squeegee or squeezing roller to produce more favorable results.

It is proper that the counter-etch solution be coated on the printing plate in a coating amount of 0.03 to 0.8 g/$m^2$ on a dry basis. The printing plate thus coated with the counter-etch solution is dried, and thereafter heated to high temperatures in a burning processor such as a commercially available burning processor "BP-1300" made by Fuji Photo Film Co., Ltd., if necessary. In this case, the heating temperature and the heating time, which vary depending upon the kinds of components constituting the image portion of the printing plate, may preferably be controlled within the range of 180 to 300° C. and 1 to 20 minutes, respectively.

After the burning treatment, the printing plate may appropriately be subjected to the conventional treatments such as water washing, gumming up and the like. When the printing plate has been treated with a counter-etch solution comprising a water-soluble polymer compound, the step of desensitization including gumming up may be omitted. The lithographic printing plate thus obtained can be set in an offset press to produce large numbers of printed matters.

Other features of this invention will become apparent in the course of the following description of exemplary embodiments, which are given for illustration of the invention and are not intended to be limiting thereof.

EXAMPLES

Fabrication of Heat-Sensitive PS Plates for Lithographic Printing

Heat-sensitive PS plates A to C for lithographic printing were fabricated in the following manners.

[Heat-Sensitive PS Plate A for Lithographic Printing]

<Preparation of Substrate>

An aluminum plate with a thickness of 0.24 mm was subjected to the consecutive surface-treatments as shown below. The aluminum plate was made of an aluminum alloy with the following composition: 0.06% by weight of Si, 0.30% by weight of Fe, 0.014% by weight of Cu, 0.001% by weight of Mn, 0.001% by weight of Mg, 0.001% by weight of Zn, 0.03% by weight of Ti, and the balance of Al and an unavoidable impurity.

The aluminum plate was electrochemically surface-grained by continuously applying an alternating voltage of 60 Hz. An aqueous solution of nitric acid at a concentration of 10 g/liter that was heated to 80° C. was used as an electrolytic solution in which an aluminum ion was contained in an amount of 5 g/liter and an ammonium ion was contained in an amount of 0.007% by weight. After surface graining, the aluminum plate was washed with water and subjected to etching by spraying an etching solution of 32° C. containing 26% by weight of sodium hydroxide and 6.5% by weight of aluminum ion on the aluminum plate, thereby etching the aluminum plate at a ratio of 0.20 g/$m^2$. After water was sprayed on the aluminum plate for washing, the aluminum plate was subjected to desmutting by spraying a 25% aqueous solution of sulfuric acid heated to 60° C., containing 0.5% by weight of aluminum ion, on the aluminum plate, and thereafter washed with water by spraying.

Next, anodization was carried out using an anodizing apparatus capable of carrying out a double stage power supply electrolytic process. Sulfuric acid was used for an electrolytic solution in an electrolytic cell. Thereafter, the aluminum plate was washed with water by spraying. As a result, an anodized layer was deposited in a deposition amount of 2.7 g/$m^2$.

After the completion of anodization, the aluminum plate was immersed in a 1% aqueous solution of No. 3 sodium silicate which was heated to 30° C. for 10 seconds, and thereafter washed with water by spraying.

<Formation of Undercoating Layer>

After the aluminum plate was treated with an alkali metal silicate as mentioned above, a coating liquid for an undercoating layer was coated on the aluminum plate and dried at 80° C. for 15 seconds to form a layer on the aluminum plate. The undercoating layer was deposited on the aluminum plate in a deposition amount of 15 mg/$m^2$ on a dry basis.

| (Formulation for coating liquid of undercoating layer) | |
|---|---|
| Compound with the following formula: | 0.3 g |
| 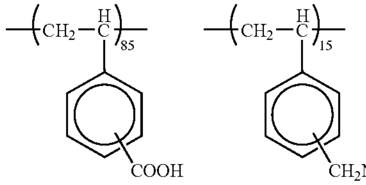 | |
| Methanol | 100 g |
| Water | 1 g |

<Formation of Lower Layer and Upper Heat-Sensitive Layer>

On the aluminum web thus obtained, a coating liquid No. 1 for forming a lower layer was coated with a coating amount of 0.85 g/$m^2$ using a bar coater and dried at 160° C. for 44 seconds. Immediately after that, cool air of 17 to 20° C. was blown on the coated surface until the temperature of the aluminum web was decreased to 35° C., so that a lower layer was provided.

Then, a coating liquid No. 1 for forming an upper heat-sensitive layer was coated on the lower layer with a coating amount of 0.22 g/$m^2$ using a bar coater, dried at 148° C. for 25 minutes, and then gradually cooled by air blow of 20 to 26° C. Thus, a PS plate A for lithographic printing was fabricated.

| (Formulation for coating liquid No. 1 of lower layer) | |
|---|---|
| N-(4-aminosulfonylphenyl)methacrylamide-acrylonitrile-methyl methacrylate copolymer (36/34/30, weight-average molecular weight: 50000, acid value: 2.65) | 2.133 g |
| Cyanine dye A with the following formula: | 0.134 g |
| 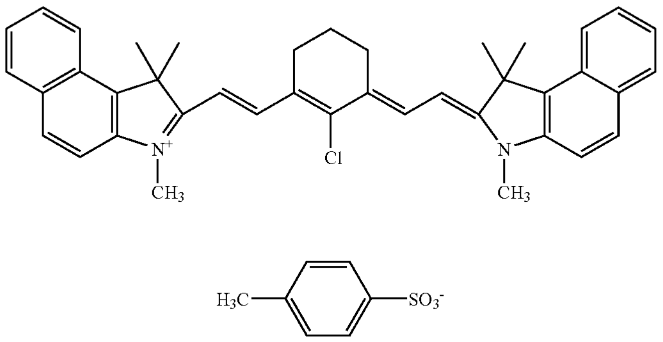 | |
| 4,4'-bishydroxyphenylsulfone | 0.126 g |
| Tetrahydrophthalic anhydride | 0.190 g |
| p-toluenesulfonic acid | 0.008 g |
| 3-methoxy-4-diazodiphenylamine hexafluorophosphate | 0.032 g |
| Ethyl Violet modified to have as a counterion 6-hyclroxynaphthalenesulfone | 0.781 g |
| Fluorine-containing surfactant "Megafac F 176" (trade name), made by Dainippon Ink & Chemicals, Incorporated | 0.035 g |
| Methyl ethyl ketone | 25.41 g |
| 1-methoxy-2-propanol | 12.97 g |
| γ-butyrolactone | 13.18 g |

| (Formulation for coating liquid No. 1 of upper heat-sensitive layer) | |
|---|---|
| m,p-cresol novolak resin (m/p ratio: 6/4, weight-average molecular weight: 4500, content of unreacted cresol: 0.8% by weight) | 0.3479 g |
| Cyanine dye A | 0.0192 g |
| 30% MEK solution of ethyl methacrylate-isobutyl methacrylate-acrylic acid copolymer (37/37/26 wt %) | 0.1403 g |
| Surfactant "Megafac F780F" (30%) (trade name), made by Dainippon Ink & Chemicals, Incorporated | 0.015 g |
| Surfactant "Megafac F781F" (trade name), made by Dainippon Ink & Chemicals, Incorporated | 0.00328 g |
| Methyl ethyl ketone | 13.07 g |
| 1-methoxy-2-propanol | 6.79 g |

[Heat-Sensitive PS Plate B for Lithographic Printing]

The procedure for fabrication of the heat-sensitive PS plate A for lithographic printing mentioned above was repeated except that the coating liquid No. 1 for forming the upper heat-sensitive layer was replaced by a coating liquid No. 2 as shown below. Thus, a PS plate B for lithographic printing was fabricated.

(Formulation for Coating Liquid No. 2 of Upper Heat-Sensitive Layer)

| | |
|---|---|
| m,p-cresol novolak resin (m/p ratio: 6/4, weight-average molecular weight: 4500, content of unreacted cresol: 0.8% by weight) | 0.3478 g |
| Cyanine dye A | 0.0192 g |
| Ammonium compound employed in Example 2 in JP Application No. 2001-398047 | 0.0115 g |
| Surfactant "Megafac F176" (20%) (trade name), made by Dainippon Ink & Chemicals, Incorporated | 0.022 g |
| Methyl ethyl ketone | 13.07 g |
| 1-methoxy-2-propanol | 6.79 g |

[Heat-Sensitive PS Plate C for Lithographic Printing]

<Preparation of Substrate>

After an aluminum plate (1050) with a thickness of 0.30 mm was immersed for 10 seconds in a 5% aqueous solution of sodium hydroxide which was heated to 40° C. to carry out a degreasing treatment, the aluminum plate was subjected to electrolytic etching for 30 seconds at a current density of 40 $A/dm^2$ in an aqueous solution of hydrochloric acid with a concentration of 0.5 mol/liter that was heated to 25° C. Then, desmutting was carried out by immersing the aluminum plate in a 5% aqueous solution of sodium hydroxide for 10 seconds at 30° C., and thereafter anodization was conducted in a 20% aqueous solution of sulfuric acid at a current density of 5 A/dm2 for one minute, with the liquid temperature being controlled to 20° C. Thus, an aluminum substrate for the PS plate used in lithographic printing was obtained.

<Formation of Lower Layer>

On the aluminum substrate thus obtained, a coating liquid No. 2 for forming a lower layer was coated using a wire bar and dried at 90° C. for 20 seconds, so that a lower layer with a deposition amount of 1.3 $g/m^2$ on a dry basis was provided on the aluminum substrate.

| (Formulation for coating liquid No. 2 of lower layer) | |
|---|---|
| 20% methanol solution of m-cresol novolak resin "BRM 565" made by Showa Highpolymer Co., Ltd. (Mw = 2500 to 3500) | 50 parts by weight |
| 5% methanol dispersion of Compound A with the following formula: | 40 parts by weight |

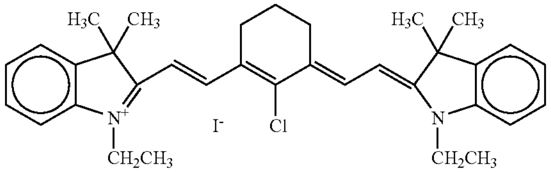

<Formation of Upper-Sensitive Layer>

Then, a coating liquid No. 3 for forming an upper heat-sensitive layer was coated on the lower layer using a wire bar and dried at 90° C. for 20 minutes, so that an upper heat-sensitive layer was provided with a deposition amount of 0.2 $g/m^2$ on a dry basis. Thus, a PS plate C for lithographic printing was fabricated.

| | |
|---|---|
| (Formulation for coating liquid No. 3 of upper heat-sensitive layer) 20% methanol solution of m-cresol novolak resin "BRM 565" made by Showa Highpolymer Co., Ltd. (Mw = 2500 to 3500) | 50 parts by weight |
| 5% methanol dispersion of Compound A | 40 parts by weight |
| 5% methanol solution of polyethylene glycol (average molecular weight: 4000) | 20 parts by weight |
| Methanol | 90 parts by weight |

[Preparation of Developing Solutions]

Developing solutions were prepared to have appropriate pH values by adjusting the concentration of an alkaline chemical used in each developing solution so as to prevent the light-exposed image forming layer portions of the PS plate from remaining after development. The light beam with an intensity of 4 W was imagewise applied to each of the above-mentioned PS plates A to C at a rotational frequency of 150 rpm to form a solid image thereon and development was carried out at 30° C. for 12 seconds using a commercially available plate setter "Trendsetter" (trade name), made by Creo Products Inc.

<Preparation of Non-Silicate Alkaline Developing Solutions>

To one liter of a 5.0% aqueous solution of a potassium salt prepared from a combination of a non-reducing sugar and a base, that is, D-sorbitol and potassium oxide ($K_2O$), a surfactant selected from the group consisting of anionic surfactants A to H and ampholytic surfactants I to K, which are shown below, and an alkali metal salt or ammonium cation salt selected from the group consisting of compounds (a) to (p), which are also shown below, were added at the predetermined concentrations shown in Tables 1 and 2. Potassium hydroxide (KOH) serving as the alkaline chemical was further added to the solution in such a manner as mentioned above, so that alkaline developing solutions (1) to (40) for use in the present invention were prepared.

For comparison purposes, a comparative developing solution (1) was prepared in the same manner as in the preparation of the non-silicate alkaline developing solution (11) except that the alkali metal salt (a) was not added, and a comparative developing solution (II) was prepared in the same manner as in the preparation of the non-silicate alkaline developing solution (1) except that neither the surfactant A nor the alkali metal salt (a) was added.

<Preparation of Silicate Alkaline Developing Solutions>

To one liter of a 4.0% aqueous solution of potassium silicate prepared from a combination of silicon dioxide ($SiO^2O$) and potassium oxide ($K_2O$) at a mixing ratio ($SiO_2/K_2O$) of 1.1, a surfactant selected from the group consisting of anionic surfactants A to H and ampholytic surfactants I to K, which are shown below, and an alkali metal salt or ammonium salt selected from the group consisting of compounds (a) to (p), which are also shown below, were added at the predetermined concentrations shown in Tables 3 to 4. Potassium hydroxide (KOH) serving as the alkaline chemical was further added to the solution in such a manner as mentioned above, so that alkaline developing solutions (41) to (80) for use in the present invention were prepared.

For comparison purposes, a comparative developing solution (III) was prepared in the same manner as in preparation of the silicate alkaline developing solution (51) except that the alkali metal salt (a) was not added, and a comparative developing solution (IV) was prepared in the same manner as in preparation of the silicate alkaline developing solution (41) except that neither the surfactant A nor the alkali metal salt (a) was added.

(Anionic Surfactants)
A: Sodium oleate
B: Potassium laurate
C: Sodium laurylsulfonate
D: Sodium dodecylbenzenesulfonate
E: Sodium dibutylnaphthalenesulfonate
F: Sodium lauryl diphenyl ether disulfonate
G: Condensate of naphthalene sulfonate and formalin
H: Disodium salt of N-alkylsulfosuccinic monoamide (Ampholytic Surfactants)
I: Dialkylaminocarboxylic acid
J: Sodium alkylaminocarboxylic acid
K: Sodium alkylaminodicarboxylic acid (Alkali Metal Salts and Ammonium Cation Salt)
a: Tripotassium citrate
b: Trisodium citrate
c: Sodium chloride
d: Potassium chloride
e: Potassium nitrate
f: Potassium sulfate
g: Sodium carbonate
h: Potassium carbonate
i: Lithium carbonate
j: Ammonium carbonate
k: Tripotassium phosphate
l: Sodium tetraborate
m: Sodium acetate
n: Disodium malate
o: Disodium tartrate
p: Sodium gluconate

TABLE 1

| Non-silicate Alkaline | Surfactant | | Alkali Metal Salt or Ammonium Cation Salt | | Concentration |
|---|---|---|---|---|---|
| Developing Solution No. | | Concentration A(g/L) | | Cation molarity B(mol/L) | Ratio (A/B) |
| (1) | A | 1.0 | a | 0.3 | 3.3 |
| (2) | B | 1.0 | a | 0.3 | 3.3 |
| (3) | C | 1.0 | a | 0.3 | 3.3 |
| (4) | D | 1.0 | a | 0.3 | 3.3 |
| (5) | E | 1.0 | a | 0.3 | 3.3 |
| (6) | F | 1.0 | a | 0.3 | 3.3 |
| (7) | G | 1.0 | a | 0.3 | 3.3 |
| (8) | H | 1.0 | a | 0.3 | 3.3 |
| (9) | I | 1.0 | a | 0.3 | 3.3 |
| (10) | J | 1.0 | a | 0.3 | 3.3 |
| (11) | K | 1.0 | a | 0.3 | 3.3 |
| (12) | K | 1.0 | a | 0.01 | 100 |
| (13) | K | 1.0 | a | 1.0 | 1.0 |
| (14) | K | 0.001 | a | 0.3 | 0.003 |
| (15) | K | 0.1 | a | 0.3 | 0.3 |
| (16) | K | 10 | a | 0.3 | 333 |
| (17) | K | 0.001 | a | 0.01 | 0.1 |
| (18) | K | 0.1 | a | 0.01 | 10 |
| (19) | K | 10 | a | 0.01 | 1000 |
| (20) | K | 0.001 | a | 1.0 | 0.001 |

TABLE 1-continued

| Non-silicate Alkaline | Surfactant | | Alkali Metal Salt or Ammonium Cation Salt | | Concentration |
|---|---|---|---|---|---|
| Developing Solution No. | | Concentration A(g/L) | | Cation molarity B(mol/L) | Ratio (A/B) |
| (21) | K | 0.1 | a | 1.0 | 0.1 |
| (22) | K | 10 | a | 1.0 | 10 |

TABLE 2

| Non-silicate Alkaline | Surfactant | | Alkali Metal Salt or Ammonium Cation Salt | | Concentration |
|---|---|---|---|---|---|
| Developing Solution No. | | Concentration A(g/L) | | Cation molarity B(mol/L) | Ratio (A/B) |
| (23) | K | 1.0 | b | 0.3 | 3.3 |
| (24) | K | 1.0 | c | 0.3 | 3.3 |
| (25) | K | 1.0 | d | 0.3 | 3.3 |
| (26) | K | 1.0 | e | 0.3 | 3.3 |
| (27) | K | 1.0 | f | 0.3 | 3.3 |
| (28) | K | 1.0 | g | 0.3 | 3.3 |
| (29) | K | 1.0 | h | 0.3 | 3.3 |
| (30) | K | 1.0 | i | 0.3 | 3.3 |
| (31) | K | 1.0 | j | 0.3 | 3.3 |
| (32) | K | 1.0 | k | 0.3 | 3.3 |
| (33) | K | 1.0 | l | 0.3 | 3.3 |
| (34) | K | 1.0 | m | 0.3 | 3.3 |
| (35) | K | 1.0 | n | 0.3 | 3.3 |
| (36) | K | 1.0 | o | 0.3 | 3.3 |
| (37) | K | 1.0 | p | 0.3 | 3.3 |
| (38) | F | 1.0 | k | 0.3 | 3.3 |
| (39) | F | 1.0 | k | 0.3 | 3.3 |
| (40) | F | 1.0 | k | 0.3 | 3.3 |
| (I) | K | 1.0 | — | — | — |
| (II) | — | — | — | — | — |

TABLE 3

| Silicate Alkaline | Surfactant | | Alkali Metal Salt or Ammonium Cation Salt | | Concentration |
|---|---|---|---|---|---|
| Developing Solution No. | | Concentration A(g/L) | | Cation molarity B(mol/L) | Ratio (A/B) |
| (41) | A | 1.0 | a | 0.3 | 3.3 |
| (42) | B | 1.0 | a | 0.3 | 3.3 |
| (43) | C | 1.0 | a | 0.3 | 3.3 |
| (44) | D | 1.0 | a | 0.3 | 3.3 |
| (45) | E | 1.0 | a | 0.3 | 3.3 |
| (46) | F | 1.0 | a | 0.3 | 3.3 |
| (47) | G | 1.0 | a | 0.3 | 3.3 |
| (48) | H | 1.0 | a | 0.3 | 3.3 |
| (49) | I | 1.0 | a | 0.3 | 3.3 |
| (50) | J | 1.0 | a | 0.3 | 3.3 |
| (51) | K | 1.0 | a | 0.3 | 3.3 |
| (52) | K | 1.0 | a | 0.01 | 100 |
| (53) | K | 1.0 | a | 1.0 | 1.0 |
| (54) | K | 0.001 | a | 0.3 | 0.003 |
| (55) | K | 0.1 | a | 0.3 | 0.3 |
| (56) | K | 10 | a | 0.3 | 333 |
| (57) | K | 0.001 | a | 0.01 | 0.1 |
| (58) | K | 0.1 | a | 0.01 | 10 |
| (59) | K | 10 | a | 0.01 | 1000 |
| (60) | K | 0.001 | a | 1.0 | 0.001 |
| (61) | K | 0.1 | a | 1.0 | 0.1 |
| (62) | K | 10 | a | 1.0 | 10 |

TABLE 4

| Non-silicate Alkaline Developing Solution No. | | Surfactant Concentration A(g/L) | Alkali Metal Salt or Ammonium Cation Salt | Cation molarity B(mol/L) | Concentration Ratio (A/B) |
|---|---|---|---|---|---|
| (63) | K | 1.0 | b | 0.3 | 3.3 |
| (64) | K | 1.0 | c | 0.3 | 3.3 |
| (65) | K | 1.0 | d | 0.3 | 3.3 |
| (66) | K | 1.0 | e | 0.3 | 3.3 |
| (67) | K | 1.0 | f | 0.3 | 3.3 |
| (68) | K | 1.0 | g | 0.3 | 3.3 |
| (69) | K | 1.0 | h | 0.3 | 3.3 |
| (70) | K | 1.0 | i | 0.3 | 3.3 |
| (71) | K | 1.0 | j | 0.3 | 3.3 |
| (72) | K | 1.0 | k | 0.3 | 3.3 |
| (73) | K | 1.0 | l | 0.3 | 3.3 |
| (74) | K | 1.0 | m | 0.3 | 3.3 |
| (75) | K | 1.0 | n | 0.3 | 3.3 |
| (76) | K | 1.0 | o | 0.3 | 3.3 |
| (77) | K | 1.0 | p | 0.3 | 3.3 |
| (78) | F | 1.0 | k | 0.3 | 3.3 |
| (79) | F | 1.0 | k | 0.3 | 3.3 |
| (80) | F | 1.0 | k | 0.3 | 3.3 |
| (III) | K | 1.0 | — | — | — |
| (IV) | — | — | — | — | — |

Examples 1 to 80 and Comparative Examples 1 to 4

[Evaluation of Scratch Resistance]

The scratch resistance of the PS plates A to C for lithographic printing was evaluated using a commercially available rotary abrasion tester made by Toyo Seiki Seisaku-sho, Ltd. More specifically, a rotor (CS-0) around which a slip sheet was wound was set in the tester and the rotor was caused to make ten rotations on each PS plate with the application of a load of 250 g thereto.

The resultant PS plates were developed over a period of 12 seconds to obtain the corresponding printing plates using a PS processor "LP 940H" (available from Fuji Photo Film Co., Ltd.) equipped with each of the developing solutions (1) to (80) and comparative developing solutions (I) to (IV), and a finishing gum solution prepared by diluting a finishing gum ("FG-1" made by Fuji Photo Film Co., Ltd.) with water at a ratio of 1:1, with the developing solutions being maintained at 30° C.

After completion of the development, the density of one portion of the printing plate to which the rotor had been pressed and the density of another portion where no influence of the rotor was exerted were measured with a Gretag-Macbeth D19C reflection densitometer (made by Gretag-Macbeth GmbH) using the cyan color channel. A difference between the above-mentioned two densities was obtained. The scratch resistance of the printing plate is considered to be higher as the difference between the two densities becomes smaller.

The developing solutions (1) to (40) and comparative developing solutions (I) and (II) were respectively used in Examples 1 to 40 and Comparative Examples 1 and 2, the results of which are shown in Table 5; and the developing solutions (41) to (80) and the comparative developing solutions (III) and (IV) were respectively used in Examples 41 to 80 and Comparative Examples 3 and 4, the results of which are shown in Table 6.

TABLE 5

| Example No. | Developing Solution No. | Evaluation of Scratch Resistance (Difference in Density) PS plate A | PS plate B | PS plate C | Example No. | Developing Solution No. | Evaluation of Scratch Resistance (Difference in Density) PS plate A | PS plate B | PS plate C |
|---|---|---|---|---|---|---|---|---|---|
| 1 | (1) | 0.03 | 0.02 | 0.05 | 23 | (23) | 0.02 | 0.02 | 0.06 |
| 2 | (2) | 0.03 | 0.01 | 0.06 | 24 | (24) | 0.03 | 0.02 | 0.06 |
| 3 | (3) | 0.03 | 0.02 | 0.06 | 25 | (25) | 0.03 | 0.02 | 0.05 |
| 4 | (4) | 0.03 | 0.02 | 0.05 | 26 | (26) | 0.03 | 0.02 | 0.06 |
| 5 | (5) | 0.03 | 0.02 | 0.05 | 27 | (27) | 0.03 | 0.02 | 0.07 |
| 6 | (6) | 0.02 | 0.02 | 0.06 | 28 | (28) | 0.03 | 0.02 | 0.06 |
| 7 | (7) | 0.03 | 0.01 | 0.06 | 29 | (29) | 0.02 | 0.02 | 0.06 |
| 8 | (8) | 0.03 | 0.03 | 0.06 | 30 | (30) | 0.03 | 0.01 | 0.06 |
| 9 | (9) | 0.03 | 0.01 | 0.06 | 31 | (31) | 0.03 | 0.02 | 0.06 |
| 10 | (10) | 0.02 | 0.02 | 0.06 | 32 | (32) | 0.02 | 0.02 | 0.06 |
| 11 | (11) | 0.02 | 0.02 | 0.06 | 33 | (33) | 0.03 | 0.02 | 0.07 |
| 12 | (12) | 0.04 | 0.03 | 0.08 | 34 | (34) | 0.03 | 0.01 | 0.06 |
| 13 | (13) | 0.03 | 0.02 | 0.06 | 35 | (35) | 0.02 | 0.02 | 0.06 |
| 14 | (14) | 0.03 | 0.02 | 0.07 | 36 | (36) | 0.03 | 0.02 | 0.06 |
| 15 | (15) | 0.03 | 0.02 | 0.06 | 37 | (37) | 0.03 | 0.02 | 0.06 |
| 16 | (16) | 0.02 | 0.02 | 0.06 | 38 | (38) | 0.03 | 0.02 | 0.06 |
| 17 | (17) | 0.04 | 0.02 | 0.07 | 39 | (39) | 0.03 | 0.01 | 0.06 |
| 18 | (18) | 0.03 | 0.03 | 0.05 | 40 | (40) | 0.03 | 0.02 | 0.05 |
| 19 | (19) | 0.04 | 0.02 | 0.06 | Comp. Ex.1 | (I) | 0.09 | 0.07 | 0.13 |
| 20 | (20) | 0.03 | 0.02 | 0.06 | Comp. Ex. 2 | (II) | 0.10 | 0.08 | 0.15 |
| 21 | (21) | 0.02 | 0.02 | 0.06 | | | | | |
| 22 | (22) | 0.03 | 0.02 | 0.05 | | | | | |

TABLE 6

| Example No. | Developing Solution No. | Evaluation of Scratch Resistance (Difference in Density) PS plate A | PS plate B | PS plate C | Example No. | Developing Solution No. | Evaluation of Scratch Resistance (Difference in Density) PS plate A | PS plate B | PS plate C |
|---|---|---|---|---|---|---|---|---|---|
| 41 | (41) | 0.04 | 0.02 | 0.05 | 63 | (63) | 0.03 | 0.02 | 0.06 |
| 42 | (42) | 0.03 | 0.01 | 0.07 | 64 | (64) | 0.03 | 0.02 | 0.06 |
| 43 | (43) | 0.04 | 0.03 | 0.06 | 65 | (65) | 0.03 | 0.02 | 0.05 |
| 44 | (44) | 0.03 | 0.02 | 0.06 | 66 | (66) | 0.03 | 0.03 | 0.06 |
| 45 | (45) | 0.03 | 0.03 | 0.05 | 67 | (67) | 0.03 | 0.02 | 0.07 |
| 46 | (46) | 0.03 | 0.02 | 0.06 | 68 | (68) | 0.04 | 0.02 | 0.06 |
| 47 | (47) | 0.03 | 0.02 | 0.06 | 69 | (69) | 0.02 | 0.02 | 0.05 |
| 48 | (48) | 0.04 | 0.03 | 0.06 | 70 | (70) | 0.03 | 0.02 | 0.06 |
| 49 | (49) | 0.03 | 0.01 | 0.07 | 71 | (71) | 0.04 | 0.03 | 0.06 |
| 50 | (50) | 0.02 | 0.03 | 0.07 | 72 | (72) | 0.02 | 0.02 | 0.07 |
| 51 | (51) | 0.04 | 0.02 | 0.07 | 73 | (73) | 0.03 | 0.03 | 0.07 |
| 52 | (52) | 0.04 | 0.04 | 0.08 | 74 | (74) | 0.03 | 0.02 | 0.06 |
| 53 | (53) | 0.03 | 0.02 | 0.06 | 75 | (75) | 0.02 | 0.02 | 0.07 |
| 54 | (54) | 0.03 | 0.03 | 0.07 | 76 | (76) | 0.03 | 0.02 | 0.06 |
| 55 | (55) | 0.03 | 0.03 | 0.06 | 77 | (77) | 0.03 | 0.02 | 0.06 |
| 56 | (56) | 0.03 | 0.02 | 0.06 | 78 | (78) | 0.03 | 0.03 | 0.06 |
| 57 | (57) | 0.04 | 0.02 | 0.07 | 79 | (79) | 0.02 | 0.01 | 0.06 |
| 58 | (58) | 0.03 | 0.02 | 0.05 | 80 | (80) | 0.03 | 0.03 | 0.05 |
| 59 | (59) | 0.04 | 0.03 | 0.06 | Comp Ex. 3 | (III) | 0.10 | 0.08 | 0.15 |
| 60 | (60) | 0.03 | 0.02 | 0.07 | Comp Ex. 4 | (IV) | 0.11 | 0.10 | 0.18 |
| 61 | (61) | 0.02 | 0.03 | 0.06 | | | | | |
| 62 | (62) | 0.03 | 0.03 | 0.05 | | | | | |

Examples 81 to 160 and Comparative Examples 5 to 8

[Evaluation of Image Contrast]

Using a commercially available plate setter "Trendsetter" (trade name), made by Creo Products Inc., the light beam with an intensity of 4 W was imagewise applied to each of the above-mentioned PS plates A to C at a rotational frequency of 150 rpm to form a solid image thereon.

After completion of the light exposure, each PS plate was developed over a period of 12 seconds to obtain a printing plate using a PS processor "LP 940H" (available from Fuji Photo Film Co., Ltd.) equipped with each of the developing solutions (1) to (80) and comparative developing solutions (1) to (IV), and a finishing gum solution prepared by diluting a finishing gum ("FG-1" made by Fuji Photo Film Co., Ltd.) with water at a ratio of 1:1, with the developing solution being maintained at 30° C.

After completion of the development, the printing plate was observed with a 25× loupe to recognize that the light-exposed image forming layer portions were eliminated from the PS plate to such a degree that no scumming would occur. Then, the density of an image portion on the obtained printing plate was measured with a Gretag-Macbeth sD19C reflection densitometer (made by Gretag-Macbeth GmbH) using the cyan color channel.

Before the development, the density of an image forming layer portion in each of the PS plates A to C was measured in the same manner as mentioned above for comparison. The image contrast of the printing plate is considered to be higher as the difference in the density before and after the development becomes smaller.

The developing solutions (1) to (40) and comparative developing solutions (I) and (II) were respectively used in Examples 81 to 120 and Comparative Examples 5 and 6, the results of which are shown in Table 7; and the developing solutions (41) to (80) and the comparative developing solutions (III) and (IV) were respectively used in Examples 121 to 160 and Comparative Examples 7 and 8, the results of which are shown in Table 8.

TABLE 7

| Example No. | Developing Solution No. | Evaluation of Image Contrast (Difference in Density) PS plate A | PS plate B | PS plate C | Example No. | Developing Solution No. | Evaluation of Image Contrast (Difference in Density) PS plate A | PS plate B | PS plate C |
|---|---|---|---|---|---|---|---|---|---|
| 81 | (1) | 0.03 | 0.02 | 0.04 | 103 | (23) | 0.05 | 0.04 | 0.06 |
| 82 | (2) | 0.02 | 0.03 | 0.05 | 104 | (24) | 0.03 | 0.02 | 0.06 |
| 83 | (3) | 0.03 | 0.02 | 0.05 | 105 | (25) | 0.03 | 0.02 | 0.07 |
| 84 | (4) | 0.03 | 0.02 | 0.05 | 106 | (26) | 0.03 | 0.03 | 0.06 |
| 85 | (5) | 0.04 | 0.02 | 0.05 | 107 | (27) | 0.03 | 0.02 | 0.07 |

TABLE 7-continued

| Example No. | Developing Solution No. | Evaluation of Image Contrast (Difference in Density) PS plate A | PS plate B | PS plate C | Example No. | Developing Solution No. | Evaluation of Image Contrast (Difference in Density) PS plate A | PS plate B | PS plate C |
|---|---|---|---|---|---|---|---|---|---|
| 86 | (6) | 0.03 | 0.02 | 0.06 | 108 | (28) | 0.04 | 0.02 | 0.06 |
| 87 | (7) | 0.03 | 0.02 | 0.06 | 109 | (29) | 0.02 | 0.02 | 0.05 |
| 88 | (8) | 0.05 | 0.03 | 0.06 | 110 | (30) | 0.03 | 0.02 | 0.06 |
| 89 | (9) | 0.03 | 0.02 | 0.06 | 111 | (31) | 0.03 | 0.03 | 0.06 |
| 90 | (10 | 0.03 | 0.02 | 0.06 | 112 | (32) | 0.04 | 0.02 | 0.06 |
| 91 | (11) | 0.03 | 0.02 | 0.06 | 113 | (33) | 0.04 | 0.02 | 0.07 |
| 92 | (12) | 0.03 | 0.03 | 0.07 | 114 | (34) | 0.03 | 0.02 | 0.06 |
| 93 | (13) | 0.03 | 0.02 | 0.06 | 115 | (35) | 0.02 | 0.02 | 0.07 |
| 94 | (14) | 0.03 | 0.02 | 0.06 | 116 | (36) | 0.03 | 0.02 | 0.06 |
| 95 | (15) | 0.03 | 0.02 | 0.06 | 117 | (37) | 0.04 | 0.02 | 0.06 |
| 96 | (16) | 0.04 | 0.02 | 0.06 | 118 | (38) | 0.03 | 0.03 | 0.06 |
| 97 | (17) | 0.04 | 0.02 | 0.07 | 119 | (39) | 0.03 | 0.02 | 0.06 |
| 98 | (18) | 0.03 | 0.03 | 0.06 | 120 | (40) | 0.04 | 0.02 | 0.05 |
| 99 | (19) | 0.04 | 0.02 | 0.06 | Comp. Ex. 5 | (I) | 0.10 | 0.08 | 0.15 |
| 100 | (20) | 0.03 | 0.02 | 0.06 | Comp. Ex. 6 | (II) | 0.20 | 0.15 | 0.30 |
| 101 | (21) | 0.04 | 0.02 | 0.06 | | | | | |
| 102 | (22) | 0.03 | 0.02 | 0.06 | | | | | |

TABLE 8

| Example No. | Developing Solution No. | Evaluation of Image Contrast (Difference in Density) PS plate A | PS plate B | PS plate C | Example No. | Developing Solution No. | Evaluation of Image Contrast (Difference in Density) PS plate A | PS plate B | PS plate C |
|---|---|---|---|---|---|---|---|---|---|
| 121 | (41) | 0.04 | 0.02 | 0.06 | 143 | (63) | 0.04 | 0.03 | 0.06 |
| 122 | (42) | 0.03 | 0.02 | 0.07 | 144 | (64) | 0.04 | 0.02 | 0.06 |
| 123 | (43) | 0.04 | 0.04 | 0.06 | 145 | (65) | 0.03 | 0.02 | 0.08 |
| 124 | (44) | 0.03 | 0.02 | 0.06 | 146 | (66) | 0.05 | 0.03 | 0.06 |
| 125 | (45) | 0.03 | 0.03 | 0.06 | 147 | (67) | 0.03 | 0.02 | 0.07 |
| 126 | (46) | 0.04 | 0.03 | 0.06 | 148 | (68) | 0.05 | 0.04 | 0.09 |
| 127 | (47) | 0.04 | 0.03 | 0.06 | 149 | (69) | 0.04 | 0.03 | 0.08 |
| 128 | (48) | 0.04 | 0.03 | 0.06 | 150 | (70) | 0.04 | 0.04 | 0.08 |
| 129 | (49) | 0.04 | 0.03 | 0.07 | 151 | (71) | 0.04 | 0.03 | 0.07 |
| 130 | (50) | 0.04 | 0.03 | 0.07 | 152 | (72) | 0.04 | 0.04 | 0.07 |
| 131 | (51) | 0.04 | 0.03 | 0.08 | 153 | (73) | 0.03 | 0.03 | 0.07 |
| 132 | (52) | 0.04 | 0.04 | 0.08 | 154 | (74) | 0.04 | 0.03 | 0.06 |
| 133 | (53) | 0.03 | 0.03 | 0.08 | 155 | (75) | 0.04 | 0.03 | 0.07 |
| 134 | (54) | 0.04 | 0.03 | 0.07 | 156 | (76) | 0.04 | 0.03 | 0.08 |
| 135 | (55) | 0.03 | 0.03 | 0.08 | 157 | (77) | 0.03 | 0.03 | 0.06 |
| 136 | (56) | 0.04 | 0.02 | 0.08 | 158 | (78) | 0.04 | 0.03 | 0.08 |
| 137 | (57) | 0.03 | 0.02 | 0.07 | 159 | (79) | 0.04 | 0.03 | 0.08 |
| 138 | (58) | 0.03 | 0.02 | 0.08 | 160 | (80) | 0.03 | 0.03 | 0.08 |
| 139 | (59) | 0.04 | 0.03 | 0.08 | Comp. Ex. 7 | (III) | 0.15 | 0.10 | 0.18 |
| 140 | (60) | 0.04 | 0.02 | 0.07 | Comp. Ex. 8 | (IV) | 0.19 | 0.18 | 0.25 |
| 141 | (61) | 0.02 | 0.03 | 0.08 | | | | | |
| 142 | (62) | 0.03 | 0.04 | 0.08 | | | | | |

[Evaluation of Development Sludge]

The alkaline developing solutions (1) to (80), and the comparative developing solutions (I) to (IV) which had processed 10 $m^2$ of the above PS plate A per one liter were left at an ordinary temperature of from 20° C. to 25° C. for one month, and then the developing solutions were filtrated under reduced pressure using Microfilter FM made by Fuji Photo Film Co., Ltd. at the size of 0.45 μm, 0.8 μm, and 1.2 μm. Then, residual material on the filter was observed visually.

The criteria of observation is below.

⊚: no residual material was observed on 0.45 μm filter.

○: residual material was observed slightly on 0.45 μm filter, and no residual material was observed on 0.8 μm.

Δ: residual material was observed on 0.8 μm filter and 1.2 μm filter.

×: residual material was observed on 0.45 μm filter, 0.8 μm filter and 1.2 μm filter.

The evaluations of ○ and ⊚ are considered as substantially no problems in practice.

[Evaluation of Small Dot Reproducibility]

Using a commercially available plate setter "Trendsetter" (trade name), made by Creo Products Inc., the light beam with an intensity of 9 W was imagewise applied through a test pattern to the above-mentioned PS plate A at a rotational frequency of 150 rpm, and then the plate was developed using respectively the developing solutions (1) to (80) and comparative developing solutions (I) to (IV). Among the developed test pattern, the dot portion of 2% was punched out, the resulted portion was washed with water and then 1-methoxy-2-propanol to remove the top layer thereof, and the photograph of the dot portion of 2% was taken using a scanning electron microscopy (SEM) at 3000 magnification, and the dot area ratio was evaluated with respect to the data area of 100.

The criteria of observation is below.

○: 90 or more with respect to the data area of 100

Δ: not lower than 80 to less than 90 with respect to the data area of 100

×: lower than 80 with respect to the data area of 100

The small dot reproducibility is considered to be more excellent as the dot area ratio becomes higher.

The results are shown in Tables 9 and 10.

TABLE 9

| Non-Silicate Alkaline Developing Solution No. | Concentration Ratio A/B | Sludge | Small Dot Reproducibility | Non-Silicate Alkaline Developing Solution No. | Concentration Ratio A/B | Sludge | Small Dot Reproducibility |
|---|---|---|---|---|---|---|---|
| (1) | 3.3 | ○ | ○ | (23) | 3.3 | ◎ | ○ |
| (2) | 3.3 | ○ | ○ | (24) | 3.3 | ◎ | ○ |
| (3) | 3.3 | ○ | ○ | (25) | 3.3 | ◎ | ○ |
| (4) | 3.3 | ○ | ○ | (26) | 3.3 | ◎ | ○ |
| (5) | 3.3 | ○ | ○ | (27) | 3.3 | ◎ | ○ |
| (6) | 3.3 | ◎ | ○ | (28) | 3.3 | ◎ | ○ |
| (7) | 3.3 | ○ | ○ | (29) | 3.3 | ◎ | ○ |
| (8) | 3.3 | ○ | ○ | (30) | 3.3 | ◎ | ○ |
| (9) | 3.3 | ○ | ○ | (31) | 3.3 | ◎ | ○ |
| (10) | 3.3 | ○ | ○ | (32) | 3.3 | ◎ | ○ |
| (11) | 3.3 | ◎ | ○ | (33) | 3.3 | ◎ | ○ |
| (12) | 100 | ◎ | ○ | (34) | 3.3 | ◎ | ○ |
| (13) | 1.0 | ◎ | ○ | (35) | 3.3 | ◎ | ○ |
| (14) | 0.003 | Δ | ○ | (36) | 3.3 | ◎ | ○ |
| (15) | 0.3 | ◎ | ○ | (37) | 3.3 | ◎ | ○ |
| (16) | 333 | ◎ | Δ | (38) | 3.3 | ◎ | ○ |
| (17) | 0.1 | ○ | ○ | (39) | 3.3 | ◎ | ○ |
| (18) | 10 | ◎ | ○ | (40) | 3.3 | ◎ | ○ |
| (19) | 1000 | ◎ | x | (I) | — | ○ | x |
| (20) | 0.001 | x | ○ | (II) | — | x | x |
| (21) | 0.1 | ○ | ○ | | | | |
| (22) | 10 | ◎ | ○ | | | | |

TABLE 10

| Silicate Alkaline Developing Solution No. | Concentration Ratio A/B | Sludge | Small Dot Reproducibility | Silicate Alkaline Developing Solution No. | Concentration Ratio A/B | Sludge | Small Dot Reproducibility |
|---|---|---|---|---|---|---|---|
| (41) | 3.3 | ○ | ○ | (63) | 3.3 | 0 | ○ |
| (42) | 3.3 | ○ | ○ | (64) | 3.3 | ◎ | ○ |
| (43) | 3.3 | ○ | ○ | (65) | 3.3 | ◎ | ○ |
| (44) | 3.3 | ○ | ○ | (66) | 3.3 | ◎ | ○ |
| (45) | 3.3 | ○ | ○ | (67) | 3.3 | ◎ | ○ |
| (46) | 3.3 | ◎ | ○ | (68) | 3.3 | ◎ | ○ |
| (47) | 3.3 | ○ | ○ | (69) | 3.3 | ◎ | ○ |
| (48) | 3.3 | ○ | ○ | (70) | 3.3 | ◎ | ○ |
| (49) | 3.3 | ○ | ○ | (71) | 3.3 | ◎ | ○ |
| (50) | 3.3 | ○ | ○ | (72) | 3.3 | ◎ | ○ |
| (51) | 3.3 | ◎ | ○ | (73) | 3.3 | ◎ | ○ |
| (52) | 100 | ◎ | ○ | (74) | 3.3 | ◎ | ○ |
| (53) | 1.0 | ◎ | ○ | (75) | 3.3 | ◎ | ○ |
| (54) | 0.003 | Δ | ○ | (76) | 3.3 | ◎ | ○ |
| (55) | 0.3 | ◎ | ○ | (77) | 3.3 | ◎ | ○ |
| (56) | 333 | ◎ | Δ | (78) | 3.3 | ◎ | ○ |
| (57) | 0.1 | ○ | ○ | (79) | 3.3 | ◎ | ○ |
| (58) | 10 | ◎ | ○ | (80) | 3.3 | ◎ | ○ |
| (59) | 1000 | ◎ | x | (III) | — | ○ | x |
| (60) | 0.001 | x | ○ | (IV) | — | x | x |
| (61) | 0.1 | ○ | ○ | | | | |
| (62) | 10 | ◎ | ○ | | | | |

According to the present invention, when a printing plate is made from the heat-sensitive PS plate of a positive-working mode for lithographic printing, which PS plate comprises a substrate and an image forming layer on the substrate, the image forming layer comprising a lower layer and an upper heat-sensitive layer which are successively formed on the substrate in this order, the lower layer comprising a water-insoluble and alkaline-soluble resin and the upper heat-sensitive layer comprising a water-insoluble and alkaline-soluble resin and an infrared absorption dye and exhibiting an elevated solubility with respect to alkaline aqueous solutions when heated, the obtained printing plate can bear images thereon with excellent image contrast and improved scratch resistance by using a specific alkaline developing solution. Additionally, in the plate making method according to the present invention, development sludge can be well dispersed to accomplish an excellent processing stability and a stable image formation.

What is claimed is:

1. A method of making a lithographic printing plate from a heat-sensitive pre-sensitized plate of a positive-working mode for lithographic printing comprising the steps of:

exposing the heat-sensitive pre-sensitized plate to light, and developing the plate using an alkaline developing solution comprising (a) at least one surfactant selected from the group consisting of anionic surfactants and ampholytic surfactants in an amount of 0.001 to 10% by weight, and (b) at least one salt selected from the group consisting of alkali metal salts and salts of an ammonium cation, wherein the pre-sensitized plate comprises a substrate, a lower layer which comprises a water-insoluble and alkali-soluble resin, and an upper heat-sensitive layer which comprises a water-insoluble and alkali-soluble resin and an infrared absorption dye and exhibits an elevated solubility with respect to alkaline aqueous solutions when heated, said lower layer and said upper heat-sensitive layer being located on the substrate in this order.

2. The method of claim 1 wherein the amount of (a) at least one surfactant selected from the group consisting of anionic surfactants and ampholytic surfactants in the developing solution is in the range of 0.005 to 1% by weight.

3. The method of claim 2 wherein the amount of (a) at least one surfactant selected from the group consisting of anionic surfactants and ampholytic surfactants in the developing solution is in the range of 0.01 to 0.5% by weight.

4. The method of claim 1 wherein the amount of (b) at least one salt selected from the group consisting of alkali metal salts and salts of an ammonium cation in the developing solution is in the range of 0.01 to 1 mol/liter in terms of the alkali metal and/or ammonium cation.

5. The method of claim 4 wherein the amount of (b) at least one salt selected from the group consisting of alkali metal salts and salts of an ammonium cation in the developing solution is in the range of 0.05 to 0.5 mol/liter in terms of the alkali metal and/or ammonium cation.

6. The method of claim 1 wherein the ratio of the amount of (a) at least one selected from an anionic surfactant and an ampholytic surfactant in terms of A (gram/liter) to the amount of (b) at least one selected from an alkali metal and an ammonium cation in terms of B (mol/liter) in the developing solution: A/B is in the range of from 0.01 to 100.

7. The method of claim 6 wherein the A/B is in the range of from 0.1 to 50.

8. The method of claim 1 wherein (b) at least one salt selected from the group consisting of alkali metal salts and salts of an ammonium cation is selected from halide, sulfate, nitrate, phosphate, carbonate, borate, formate, acetate, propionate, maleate, lactate, levulinate, malonate, adipate, fumarate, citrate, and malate.

9. The method of claim 8 wherein (b) at least one salt selected from the group consisting of alkali metal salts and salts of an ammonium cation salt is selected from chloride salt, nitrate, sulfate, phosphate, carbonate, borate, acetate and citrate.

10. The method of claim 1 wherein the anionic surfactant is selected from fatty acid salts, abietates, hydroxyalkanesulfonates, alkanesulfonates, alkyldiphenyl ether sulfonates, diphenyl ether disulfonates, dialkylsulfosuccinate ester salts, linear alkylbenzenesulfonates, branched alkylbenzenesulfonates, alkylnaphthalenesulfonates, alkylphenoxy polyoxyethylenepropylsulfonates, polyoxyethylene alkylsulfophenyl ether salts, sodium salts of N-methyl-N-oleyltaurine, disodium salts of N-alkylsulfosuccinic monoamide, petroleum sulfonates, sulfated tallow oil, sulfates of fatty acid alkyl esters, alkyl sulfates, polyoxyethylene alkyl ether sulfates, fatty acid monoglyceride sulfates, polyoxyethylene alkylphenyl ether sulfates, polyoxyethylene styrylphenyl ether sulfates, alkyl phosphates, polyoxyethylene alkyl ether phosphates, polyoxyethylene alkylphenyl ether phosphates, partially saponified styrene-maleic anhydride copolymers, partially saponified olefin-maleic anhydride copolymers, and condensates of naphthalenesulfonate and formalin.

11. The method of claim 1 wherein the anionic surfactant is selected from carboxylic acid type surfactants and sulfonic acid type surfactants.

12. The method of claim 11 wherein the anionic surfactant is selected from fatty acid salts, abietates, hydroxyalkanesulfonates, alkanesulfonates, alkyldiphenyl ether sulfonates, diphenyl ether disulfonates, dialkylsulfosuccinate ester salts, olefin sulfonates, linear alkylbenzenesulfonates, branched alkylbenzenesulfonates, alkylnaphthalenesulfonates, alkylphenoxy polyoxyethylene propylsulfonates, polyoxyethylene alkylsulfophenyl ether salts, disodium salts of N-alkylsulfosuccinic monoamide, petroleum sulfonates, and condensates of naphthalenesulfonate and formalin.

13. The method of claim 12, the anionic surfactant is selected from diphenyl ether disulfonate salts represented by the following formula (I):

(I)

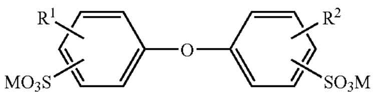

wherein $R^1$ and $R^2$ each represents a hydrogen atom or a linear or branched alkyl group, and M represents a monovalent alkali metal.

14. The method of claim 1 wherein the ampholytic surfactant is selected from amino acid type-ampholytic surfactants and betaine type-ampholytic surfactants.

15. The method of claim 1 wherein the ampholytic surfactant is selected from alkylamino dicarboxylic acids and salts thereof represented by the following formula (II):

(II)

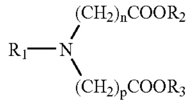

wherein $R_1$ represents an alkyl group having 4 to 30 carbon atoms, $R_2$ and $R_3$ each represents a hydrogen atom or a monovalent alkali metal, and n and p each represents an integer from 1 to 10.

* * * * *

UNITED STATES PATENT AND TRADEMARK OFFICE

CERTIFICATE OF CORRECTION

PATENT NO. : 7,018,777 B2
APPLICATION NO. : 10/658399
DATED : March 28, 2006
INVENTOR(S) : Hironori Ohnishi It is certified that error appears in the above-identified patent and that said Letters Patent is hereby corrected as shown below:

On the title page, item:
[73] Assignee: change “Minami-Ashigara” to -- Miniami-Ashigara --.

Signed and Sealed this

Fifth Day of September, 2006

JON W. DUDAS
*Director of the United States Patent and Trademark Office*

UNITED STATES PATENT AND TRADEMARK OFFICE

CERTIFICATE OF CORRECTION

PATENT NO. : 7,018,777 B2
APPLICATION NO. : 10/658399
DATED : March 28, 2006
INVENTOR(S) : Hironori Ohnishi It is certified that error appears in the above-identified patent and that said Letters Patent is hereby corrected as shown below:

Section 73 (Assignee): change “Miniami-Ashigara” to --Minami-Ashigara--.

Signed and Sealed this

Twenty-third Day of January, 2007

JON W. DUDAS
*Director of the United States Patent and Trademark Office*